US010756302B2

(12) United States Patent
Paek et al.

(10) Patent No.: US 10,756,302 B2
(45) Date of Patent: Aug. 25, 2020

(54) ELECTROLUMINESCENCE DISPLAY DEVICE

(71) Applicant: LG DISPLAY CO., LTD., Seoul (KR)

(72) Inventors: SeungHan Paek, Paju-si (KR); Suphil Kim, Paju-si (KR); Jonghoon Yeo, Paju-si (KR); Jihoon Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/226,560

(22) Filed: Dec. 19, 2018

(65) Prior Publication Data

US 2019/0207163 A1 Jul. 4, 2019

(30) Foreign Application Priority Data

Dec. 29, 2017 (KR) ........................ 10-2017-0184316

(51) Int. Cl.
*H01L 51/00* (2006.01)
*H01L 27/32* (2006.01)
(Continued)

(52) U.S. Cl.
CPC ...... *H01L 51/5265* (2013.01); *H01L 27/3223* (2013.01); *H01L 27/3244* (2013.01); *H01L 27/3246* (2013.01); *H01L 27/3262* (2013.01); *H01L 27/3272* (2013.01); *H01L 27/3276* (2013.01); *H01L 51/0005* (2013.01); *H01L 51/5012* (2013.01); *H01L 51/5056* (2013.01); *H01L 51/5088* (2013.01);
(Continued)

(58) Field of Classification Search
CPC ............. H01L 27/3244; H01L 27/3276; H01L 27/3272; H01L 27/3262; H01L 27/3246; H01L 27/3223; H01L 27/1225; H01L 27/322; H01L 27/3211; H01L 29/7869; H01L 29/78633; H01L 2251/558; H01L 2251/5315; H01L 2251/308; H01L 51/5265; H01L 51/5209; H01L 51/5088; H01L 51/5056; H01L 51/5012; H01L 51/5218; H01L 51/0005; H01L 51/5203
See application file for complete search history.

(56) References Cited

U.S. PATENT DOCUMENTS

2005/0140274 A1 6/2005 Lee et al.
2005/0140277 A1 6/2005 Suzuki et al.
(Continued)

FOREIGN PATENT DOCUMENTS

KR 20170035356 A 3/2017
TW 200607387 A 2/2006

OTHER PUBLICATIONS

Office Action issued in corresponding Taiwanese Patent Application No. 107147814 dated Oct. 8, 2019.

*Primary Examiner* — Galina G Yushina
(74) *Attorney, Agent, or Firm* — Polsinelli PC

(57) ABSTRACT

An electroluminescent display device includes a substrate, a bank provided on the substrate and configured to define a first emission area and a second emission area, a first emission layer provided in the first emission area, a second emission layer provided in the second emission area, a first electrode provided below the first emission layer, and a second electrode provided below the second emission layer, wherein a thickness of a first portion of the first electrode is larger than a thickness of a first portion of the second electrode.

21 Claims, 12 Drawing Sheets

(51) Int. Cl.

| | |
|---|---|
| ***H01L 51/50*** | (2006.01) |
| ***H01L 51/52*** | (2006.01) |
| *H01L 27/12* | (2006.01) |
| *H01L 29/786* | (2006.01) |

(52) U.S. Cl.

CPC ...... *H01L 51/5209* (2013.01); *H01L 51/5218* (2013.01); *H01L 27/1225* (2013.01); *H01L 29/7869* (2013.01); *H01L 29/78633* (2013.01); *H01L 51/5203* (2013.01); *H01L 2251/308* (2013.01); *H01L 2251/5315* (2013.01); *H01L 2251/558* (2013.01)

(56) References Cited

U.S. PATENT DOCUMENTS

| | | | | |
|---|---|---|---|---|
| 2005/0269947 | A1* | 12/2005 | Kobayashi | H01L 27/3211 313/504 |
| 2006/0160277 | A1* | 7/2006 | Sirringhaus | H01L 51/0005 438/149 |
| 2013/0134474 | A1 | 5/2013 | Takeuchi et al. | |
| 2014/0239272 | A1 | 8/2014 | Kim | |
| 2015/0144925 | A1* | 5/2015 | Baek | H01L 27/3213 257/40 |
| 2017/0207290 | A1 | 7/2017 | Lee et al. | |
| 2017/0243928 | A1* | 8/2017 | Yang | H01L 27/3211 |
| 2018/0315802 | A1* | 11/2018 | Kamiyama | H01L 51/5246 |
| 2019/0206949 | A1* | 7/2019 | Park | H01L 27/3216 |
| 2019/0207163 | A1* | 7/2019 | Paek | H01L 27/3246 |

* cited by examiner

VDD
C1
CH1
DL1
DL2
C2
CH2
Ref1
CH3
C3
LS
DL3
VSS
AE3
CH4,CH5
AE2
CL1
AE1
S2
D2
A2
G2
T2
CE2
CE1
D1
G1
A1
S1
T1
GL
SCL
S3
G3
D3
A3
T3
CL2

ELECTROLUMINESCENCE DISPLAY DEVICE

CROSS REFERENCE TO RELATED APPLICATION

This application claims the benefit under 35 U.S.C. § 119(a) of Korean Patent Application No. 10-2017-0184316 filed on Dec. 29, 2017, which is incorporated herein by reference in its entirety.

BACKGROUND

Field of the Disclosure

The present disclosure relates to an electroluminescent display device, and more particularly, to an electroluminescent display device having an emission layer manufactured by a solution process.

Description of the Background

An electroluminescent display device is provided in such way that an emission layer is formed between two electrodes. As the emission layer emits light due to an electric field between the two electrodes, an image is displayed on the electroluminescent display device.

The emission layer may be formed of an organic material which emits light when an exciton is produced by a bond of an electron and a hole, and the exciton falls to a ground state from an excited state, or may be formed of an inorganic material such as a quantum dot.

Hereinafter, a related art electroluminescent display device will be described with reference to the accompanying drawings.

FIG. 1 is a cross-sectional view illustrating the related art electroluminescent display device.

As shown in FIG. 1, the related art electroluminescent display device includes a substrate 10, a circuit device layer 20, a first electrode 30, a bank 40, and emission layers 51, 52 and 53.

The circuit device layer 20 is formed on the first substrate 10. Various signal lines, a thin film transistor, and a capacitor are formed in the circuit device layer 20.

The first electrode 30 is formed on the circuit device layer 20. The first electrode 30 is patterned on each pixel, wherein the first electrode 30 functions as an anode of the electroluminescent display device.

The bank 40 is formed in a matrix configuration, to thereby define a plurality of emission areas.

The emission layers 51, 52 and 53 may include red (R) emitting layer 51, green (G) emitting layer 52, and blue (B) emitting layer 53 individually formed in the plurality of emission areas defined by the bank 40. The emission layers 51, 52 and 53 may be formed on the first electrode 30, which is exposed in the emission area, by a solution process using an inkjet apparatus. Although not shown in FIG. 1, a second electrode is formed on the emission layers 51, 52 and 53.

The related art electroluminescent display device has the following disadvantages.

In the case of the related art, a thickness of the emission layer 51, 52 and 53 is set in consideration of a micro-cavity property of each pixel so as to improve an external extraction efficiency of light. In detail, the red (R) emitting layer 51 has the largest thickness, the blue (B) emitting layer 53 has the smallest thickness, and the green (G) emitting layer 52 has the middle thickness.

Accordingly, in order to realize the large thickness of the red (R) emitting layer 51 by the solution process, a solution has to be sprayed several times through a nozzle of the inkjet apparatus, thereby causing an increase of process time.

Also, if the blue (B) emitting layer 53 has the small thickness resulting from the solution process, it is difficult to realize uniformity of profile of the blue (B) emitting layer 53, which might cause a possibility of a dark spot in a blue pixel.

SUMMARY

The present disclosure has been made in view of the above problems and is to provide an electroluminescent display device capable of reducing processing time by decreasing the number of spraying times of a solution for forming an emission layer through a nozzle of an inkjet apparatus, and capable of overcoming a problem related with a dark spot in a specific pixel by realizing a uniform profile of the emission layer.

In accordance with an aspect of the present disclosure, an electroluminescent display device includes a substrate, a bank provided on the substrate and configured to define a first emission area and a second emission area, a first emission layer provided in the first emission area, a second emission layer provided in the second emission area, one electrode provided below the first emission layer, and another electrode provided below the second emission layer, wherein a thickness of a portion of one electrode overlapped with the first emission area is larger than a thickness of a portion of another electrode overlapped with the second emission area.

In accordance with another aspect of the present disclosure, there is provided an electroluminescent display device comprising a substrate, a bank provided on the substrate and configured to define a first emission area and a second emission area, a first emission layer provided in the first emission area, and a second emission layer provided in the second emission area, wherein the second emission area includes a first sub emission area and a second sub emission area which are separated from each other under the circumstances that the bank is positioned in-between, and the second emission layer includes a first sub emission layer provided in the first sub emission area, and a second sub emission layer provided in the second sub emission area.

In accordance with a further aspect of the present disclosure, there is provided an electroluminescent display device comprising a substrate, a power line including a high power line and a low power line arranged in a first direction on the substrate, a plurality of circuit device columns provided with a plurality of thin film transistors and positioned between the high power line and the low power line on the substrate, a bank provided on the power line and the plurality of circuit device columns, and configured to define a first emission area and a second emission area, a first emission layer provided in the first emission area, and a second emission layer provided in the second emission area, wherein the first emission area is overlapped with any one among the plurality of circuit device columns, and the second emission area is overlapped with the power line and another one among the plurality of circuit device columns.

BRIEF DESCRIPTION OF THE DRAWINGS

The above features and other advantages of the present disclosure will be more clearly understood from the following detailed description taken in conjunction with the accompanying drawings, in which.

DETAILED DESCRIPTION

Figure 1:
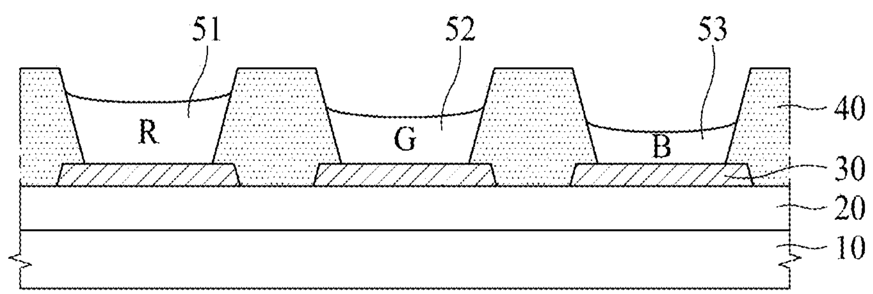
FIG. 1 is a cross-sectional view illustrating a related art electroluminescent display device.

Advantages and features of the present disclosure, and implementation methods thereof will be clarified through the following aspects, described with reference to the accompanying drawings. The present disclosure may, however, be embodied in different forms and should not be construed as being limited to the aspects set forth herein. Rather, these aspects are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing aspects of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" are used in the present specification, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or completely coupled to or combined with each other, and may be variously inter-operated with each other and driven technically as those skilled in the art can sufficiently understand. The aspects of the present disclosure may be carried out independently from each other, or may be carried out together in a co-dependent relationship.

Hereinafter, an electroluminescent display device according to an aspect of the present disclosure will be described in detail with reference to the accompanying drawings.

Figure 2:
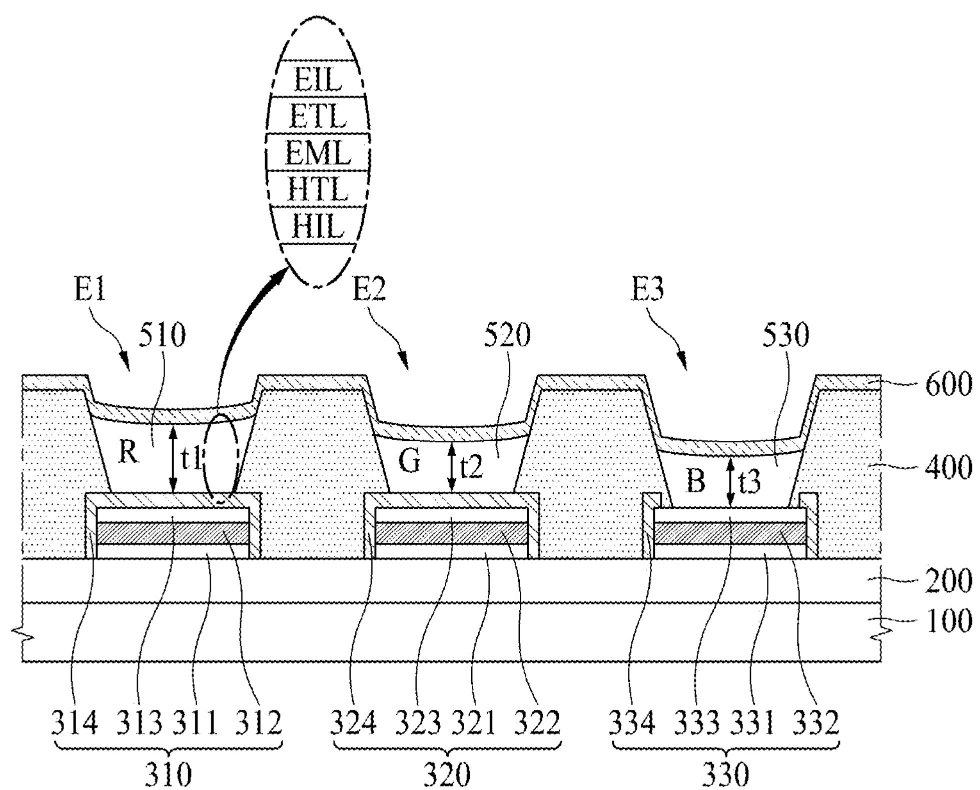
FIG. 2 is a cross-sectional view illustrating an electroluminescent display device according to one aspect of the present disclosure.

FIG. 2 is a cross sectional view illustrating an electroluminescent display device according to one aspect of the present disclosure.

As shown in FIG. 2, the electroluminescent display device according to one aspect of the present disclosure may include a substrate 100, a circuit device layer 200, a plurality of first electrodes 310, 320 and 330, a bank 400, first to third emission layers 510, 520 and 530, and a second electrode 600.

The first substrate 100 may be formed of a glass or plastic material, but is not limited to these materials. The first substrate 100 may be formed of a transparent material or an opaque material. If the electroluminescent display device according to one aspect of the present disclosure is a top emission type where emitted light advances toward an upper side, the first substrate 100 may be formed of the opaque material as well as the transparent material.

The circuit device layer 200 is formed on the substrate 100.

In the circuit device layer 200, a circuit device including various signal lines, a thin film transistor, and a capacitor is provided for each pixel. The signal lines may include a gate line, a data line, a power line, and a reference line, and the thin film transistor may include a switching thin film transistor, a driving thin film transistor, and a sensing thin film transistor.

The plurality of first electrodes 310, 320 and 330 are formed on the circuit device layer 200.

The plurality of first electrodes 310, 320 and 330 are overlapped with an emission area (E1, E2, E3) provided by each pixel. In detail, the plurality of first electrodes 310, 320 and 330 may include the first electrode 310 overlapped with the first emission area (E1) with a red (R) emission layer 510, the first electrode 320 overlapped with the second emission area (E2) with a green (G) emission layer 520, and the first electrode 330 overlapped with the third emission area (E3) with a blue (B) emission layer 530.

The first electrode 310 overlapped with the first emission area (E1) may include a first lower layer 311, a first middle layer 312, a first upper layer 313, and a first cover layer 314.

The first lower layer 311 is formed on the circuit device layer 200. The first lower layer 311 prevents a lower surface of the first middle layer 312 from being corroded. Thus, the first lower layer 311 is formed of a material having a relatively low oxidation degree and a relatively high corrosion resistance in comparison to the first middle layer 312 and may comprise, for example, a transparent conductive material such as indium-tin-oxide (ITO), but is not limited to this material.

The first upper layer 313 is formed on the first middle layer 312. The first upper layer 313 prevents an upper surface of the first middle layer 312 from being corroded. Thus, the first upper layer 313 is formed of a material having a relatively-low oxidation degree and a relatively high corrosion resistance in comparison to the first middle layer 312 and may comprise, for example, a transparent conductive material such as indium-tin-oxide (ITO), but is not limited to this material.

The first middle layer 312 is formed between the first lower layer 311 and the first upper layer 313. The first middle layer 312 is formed of a reflective material, whereby the first electrode 310 functions as a reflective electrode. Accordingly, the electroluminescent display device according to the present disclosure may be embodied in a top emission type. Also, the first middle layer 312 may be formed of a metal material whose resistance is relatively lower than that of the first lower layer 311 and the first upper layer 313. The first middle layer 312 may be formed of silver (Ag), but is not limited to this material. In order to reduce a total resistance of the first electrode 310, a thickness of the first middle layer 312 is relatively larger than a thickness of the first lower layer 311 and a thickness of the first upper layer 313.

The first cover layer 314 is formed on an entire upper surface of the first upper layer 313. The first cover layer 314 may extend to an upper surface of the circuit device layer 200 along a lateral surface of the first upper layer 313, a lateral surface of the first middle layer 312, and a lateral surface of the first lower layer 311.

The first cover layer 314 prevents the lateral surface of the first middle layer from being corroded. Thus, the first cover layer 314 is formed of a material having a relatively low oxidation degree and a relatively high corrosion resistance in comparison to the first middle layer 312 and may comprise, for example, a transparent conductive material such as indium-tin-oxide (ITO), but is not limited to this material.

A thickness of the first emission layer 510 provided in the first emission area (E1) may be reduced by the first cover layer 314, which will be described in detail as follows.

In the case of the top emission type, an image may be displayed by a transmission of light emitted from the first to third emission layers 510, 520 and 530 through the second electrode 600, or by a sequential process of a partial reflection of emitted light from the second electrode 600, a re-reflection of the light from the plurality of first electrodes 310, 320 and 330, and a transmission of the light through the second electrode 600. In this case, if a distance between the plurality of first electrodes 310, 320 and 330 and the second electrode 600 becomes an integer multiple of a half wavelength (212) of light emitted from the first emission layer 510, the second emission layer 520, and the third emission layer 530, the light is amplified by a constructive interference, whereby an external extraction efficiency of light may be improved by the continuous increase of the amplified light through the reflection and re-reflection process of the light. This property may be referred to as the micro-cavity property. Accordingly, in consideration of the micro-cavity property, the thickness of the first emission layer 510 for emitting red (R) light corresponding to a long wavelength is relatively larger than a thickness of the second emission layer 520 for emitting green (G) light corresponding to a middle wavelength and a thickness of the third emission layer 530 for emitting blue (B) light corresponding to a short wavelength.

The micro-cavity property may be obtained by the reflection and re-reflection of the light between the first electrode 310 and the second electrode 600. In more detail, the micro-cavity property may be obtained by the reflection and re-reflection of light in an area between an upper surface of the first middle layer 312 and a lower surface of the second electrode 600, that is, in a predetermined section of the first electrode 310, in which the reflection of light is generated. In this case, according to one aspect of the present disclosure, the first cover layer 314 is formed between the first middle layer 312 and the first emission layer 510. If the first emission layer 510 is decreased in its thickness, and the first cover layer 314 is increased in its thickness, it is possible to increase the distance between the upper surface of the first middle layer 312 and the lower surface of the second electrode 600, which corresponds to the section in which the reflection and re-reflection are generated. According to one aspect of the present disclosure, instead of decreasing the thickness of the first emission layer 510, the thickness of the first cover layer 314 is increased so that it is possible to adjust the distance between the upper surface of the first middle layer 312 and the lower surface of the second electrode 600 in accordance with the micro-cavity property. Accordingly, the thickness of the first cover layer 314 is larger than the thickness of the first lower layer 311 and the thickness of the first upper layer 313. However, in consideration of the resistance property, the thickness of the first middle layer 312 may be relatively larger than the thickness of the first cover layer 314.

As a result, according to one aspect of the present disclosure, it is possible to decrease the thickness of the first emission layer 510. Thus, when the first emission layer 510 is formed by the solution process, it is possible to decrease the number of times that solution is sprayed through the use of an inkjet nozzle, thereby reducing processing/manufacturing time.

The first electrode 320 overlapped with the second emission area (E2) may include a second lower layer 321, a second middle layer 322, a second upper layer 323, and a second cover layer 324. The second lower layer 321, the second middle layer 322, the second upper layer 323, and the second cover layer 324 constituting the first electrode 320 overlapped with the second emission area (E2) may be identical in structure to the first lower layer 311, the first middle layer 312, the first upper layer 313, and the first cover layer 314 constituting the first electrode 310 overlapped with the aforementioned first emission area (E1). Thus, as a thickness of the second cover layer 324 is increased in the second emission area (E2), it is possible to decrease a thickness of the second emission layer 520. Accordingly, when the second emission layer 520 is formed by the solution process, it is possible to decrease the number of times that solution is sprayed times through the use of the inkjet nozzle, thereby reducing processing/manufacturing time.

The first electrode 330 overlapped with the third emission area (E3) may include a third lower layer 331, a third middle layer 332, a third upper layer 333, and a third cover layer 334. The third lower layer 331, the third middle layer 332, and the third upper layer 333 constituting the first electrode 330 overlapped with the third emission area (E3) may be identical in structure to the first lower layer 311, the first middle layer 312, and the first upper layer 313 constituting the first electrode 310 overlapped with the aforementioned first emission area (E1). However, a structure of the third cover layer 334 included in the first electrode 330 overlapped with the third emission area (E3) is different from a structure of the first cover layer 314 included in the first electrode 310 overlapped with the first emission area (E1).

As the third emission area (E3) emits the blue (B) light with a short wavelength, the distance between the upper surface of the third middle layer 332 and the lower surface of the second electrode 600, which corresponds to the section for the reflection and re-reflection, has to be relatively reduced in consideration of the micro-cavity property. Thus, if the third cover layer 334 is formed on an entire upper surface of the third upper layer 333, the distance between the upper surface of the third middle layer 332 and the lower surface of the second electrode 600 is increased so that it is difficult to obtain the micro-cavity property. Meanwhile, even if the third cover layer 334 is formed on the entire upper surface of the third upper layer 333, it is possible to realize the micro-cavity property by decreasing the thickness of the third emission layer 530. In this case, the third emission layer 530 is too thin to obtain a desired profile, or a dark spot may be generated in a predetermined portion of the third emission area (E3) where the third emission layer 530 is not formed. In order to overcome this problem, the third cover layer 334 is not overlapped with the third emission area (E3). However, the third cover layer 334 extends to an upper surface of the circuit device layer 200 along a lateral surface of the third upper layer 333, a lateral surface of the third middle layer 332, and a lateral surface of the third lower layer 331, up to an upper edge of the third upper layer 333, so that it is possible to prevent the lateral surface of the third middle layer 332 from being corroded.

As a result, the first cover layer 314 is in contact with the lower surface of the first emission layer 510, the second cover layer 324 is in contact with the lower surface of the second emission layer 520, and the third cover layer 334 is not in contact with the lower surface of the third emission layer 530. Accordingly, a thickness of a central portion of the first electrode 310 which is overlapped with the first emission area (E1), that is, a central portion of the first electrode 310 corresponding to the area being in contact with the lower surface of the first emission layer 510, is identical to a thickness of a central portion of the first electrode 320 which is overlapped with the second emission area (E2), that is, a central portion of the first electrode 320 corresponding to the area being in contact with the lower surface of the second emission layer 520. However, the thickness of the central portion of the first electrode 310 which is overlapped with the first emission area (E1), that is, the central portion of the first electrode 310 corresponding to the area being in contact with the lower surface of the first emission layer 510, is larger than a thickness of a central portion of the first electrode 330 which is overlapped with the third emission area (E3), that is, a central portion of the first electrode 330 corresponding to the area being in contact with the lower surface of the third emission layer 530. However, a thickness of an edge portion of the first electrode 310 which is not overlapped with the first emission area (E1), that is, an edge portion of the first electrode 310 corresponding to the area being in contact with the bank 400 without being in contact with the lower surface of the first emission layer 510, is identical to a thickness of an edge of the first electrode 320 which is not overlapped with the second emission area (E2), that is, an edge portion of the first electrode 320 corresponding to the area being in contact with the bank 400 without being in contact with the lower surface of the second emission layer 520. Also, the thickness of the edge portion of the first electrode 310 which is not overlapped with the first emission area (E1), that is, the edge portion of the first electrode 310 corresponding to the area being in contact with the bank 400 without being in contact with the lower surface of the first emission layer 510, is identical to a thickness of an edge portion of the first electrode 330 which is not overlapped with the third emission area (E3), that is, an edge portion of the first electrode 330 corresponding to the area being in contact with the bank 400 without being in contact with the lower surface of the third emission layer 530.

The bank 400 is formed on the circuit device layer 200, and is configured to cover the edge of the plurality of first electrodes 310, 320 and 330. Thus, the neighboring first electrodes 310, 320 and 330 may be insulated from each other by the bank 400.

The bank 400 is formed in a matrix configuration, to thereby define the plurality of emission areas (E1, E2, E3). That is, the bank 400 is formed in the boundary area between each of the first emission area (E1), the second emission area (E2), and the third emission area (E3). Thus, the area in which the bank 400 is not formed becomes the emission area (E1, E2, E3), and a predetermined portion of an upper surface of the plurality of first electrodes 310, 320 and 330, which is not covered by the bank 400, is overlapped with the emission area (E1, E2, E3), and is then exposed to the emission area (E1, E2, E3). In detail, a predetermined portion of an upper surface of the first cover layer 314 is exposed in the first emission area (E1), a predetermined portion of an upper surface of the second cover layer 324 is exposed in the second emission area (E2), and a predetermined portion of an upper surface of the third upper layer 333 is exposed in the third emission area (E3).

The bank 400 may be formed of an organic insulating material that is hydrophilic. In this case, the first to third emission layers 510, 520 and 530 smoothly spread to a lateral surface of the bank 400 so that the first to third emission layers 510, 520 and 530 are uniformly formed in each emission area (E1, E2, E3). Meanwhile, if the entire area of the bank 400 has the hydrophilic property, the first to third emission layers 510, 520 and 530 formed in any one emission area (E1, E2, E3) overflow into the neighboring emission area (E1, E2, E3) over an upper surface of the bank 400, whereby the first to third emission layers 510, 520 and 530 formed in any one emission area (E1, E2, E3) may be mixed together with the first to third emission layers 510, 520 and 530 formed in the neighboring emission area (E1, E2, E3). Thus, the upper surface of the bank 400 has the hydrophobic property so as to prevent the mixture of the neighboring emission layers 510, 520 and 530. To this end, the bank 400 may be obtained by coating a mixture solution of an organic insulating material having the hydrophilic property and a hydrophobic material such as fluorine, and patterning the coated mixture solution by the use of a photolithography process. In response to the light irradiated in the photolithography process, the hydrophobic material such as fluorine may move to an upper portion of the bank 400, whereby the upper portion of the bank 400 may have the hydrophobic property, and the remaining portions of the bank 400 may have the hydrophilic property. In this case, the upper surface of the bank 400 has the hydrophobic property so that it is possible to decrease the spread of the neighboring emission layers 510, 520 and 530 into the upper surface of the bank 400 to some degree, thereby reducing a problem related with the mixture of the neighboring emission layers 510, 520 and 530.

The first to third emission layers 510, 520 and 530 may include the first emission layer 510 for emitting red (R) light in the first emission area (E1), the second emission layer 520 for emitting green (G) light in the second emission area (E2), and the third emission layer 530 for emitting blue (B) light in the third emission area (E3).

The first emission layer 510 is formed to be in contact with the upper surface of the first cover layer 314, the second emission layer 520 is formed to be in contact with the upper surface of the second cover layer 324, and the third emission layer 530 is formed to be in contact with the upper surface of the third upper layer 333.

The first emission layer 510 has a first thickness (t1), the second emission layer 520 has a second thickness (t2), and the third emission layer 530 has a third thickness (t3). In this present disclosure, the thickness (t1, t2, t3) of the first to third emission layers 510, 520 and 530 indicates the thickness in the center of each emission area (E1, E2, E3).

In consideration of the micro-cavity property, the first thickness (t1) may be larger than the second thickness (t2), and the second thickness (t2) may be larger than the third thickness (t3).

Meanwhile, as described above, the first cover layer 314 having the large thickness and the second cover layer 324 having the large thickness are respectively formed in the first emission area (E1) and the second emission area (E2), and are respectively overlapped with the emission areas (E1, E2), whereby the first thickness (t1) of the first emission layer 510 and the second thickness (t2) of the second emission layer 520 may be relatively decreased in comparison to the related art. However, in the case of the third emission area (E3), the third cover layer 334 is not overlapped with the third emission area (E3), whereby the third thickness (t3) of the third emission layer 530 is not decreased as compared with the related art. In this case, the third thickness (t3) of the third emission layer 530 may be larger than the second thickness (t2) of the second emission layer 520. Even in this case, there are limitations on the increase of the thickness of the first cover layer 314. Thus, it may be difficult to provide the first emission layer 510 having the first thickness (t1) which is smaller than the third thickness (t3) of the third emission layer 530. As a result, the third thickness (t3) of the third emission layer 530 may be larger than the second thickness (t2) of the second emission layer 520, and may be smaller than the first thickness (t1) of the first emission layer 510.

Each of the first to third emission layers 510, 520 and 530 may include at least one organic layer from among a hole injecting layer (HIL), a hole transporting layer (HTL), an emitting material layer (EML), an electron transporting layer (ETL), and an electron injecting layer (EIL).

In this case, a thickness of the emitting material layer (EML) of the first emission layer 510 is larger than a thickness of the emitting material layer (EML) of the second emitting layer 520, and the thickness of the emitting material layer (EML) of the second emission layer 520 is larger than a thickness of the emitting material layer (EML) of the third emission layer 530. Meanwhile, a thickness of each of the hole injecting layer (HIL), the hole transporting layer (HTL), the electron transporting layer (ETL), and the electron injecting layer (EIL) may be changed variously in each of the first to third emission layers 510, 520 and 530.

For example, as described above, if the first thickness (t1) of the first emission layer 510 is larger than the second thickness (t2) of the second emission layer 520, and the second thickness (t2) of the second emission layer 520 is larger than the third thickness (t3) of the third emission layer 530, a thickness of each of the hole injecting layer (HIL) and the hole transporting layer (HTL) constituting the first emission layer 510 is larger than a thickness of each of the hole injecting layer (HIL) and the hole transporting layer (HTL) constituting the second emission layer 520, and the thickness of each of the hole injecting layer (HIL) and the hole transporting layer (HTL) constituting the second emission layer 520 may be larger than a thickness of each of the hole injecting layer (HIL) and the hole transporting layer (HTL) constituting the third emission layer 530.

Also, if the third thickness (t3) of the third emission layer 530 is larger than the second thickness (t2) of the second emission layer 520, the thickness of the hole injecting layer (HIL) of the third emission layer 530 may be larger than the thickness of the hole injecting layer (HIL) for the second emission layer 520. However, the thickness of the hole transporting layer (HTL) of the third emission layer 530 may be smaller than the thickness of the hole transporting layer (HTL) of the second emission layer 520.

A light emission in each of the first to third emission layers 510, 520 and 530 strongly depends on the hole transporting layer (HTL) and the emitting material layer (EML), but does not strongly depend on the hole injecting layer (HIL). Thus, when the difference between the thickness of the hole injecting layer (HIL) of the third emission layer 530 and the thickness of the hole injecting layer (HIL) of the second emission layer 520 is larger than the difference between a total value obtained by adding the thickness of the hole transporting layer (HTL) of the third emission layer 530 and the thickness of the emitting material layer (EML) of the third emission layer 530 and a total value obtained by adding the thickness of the hole transporting layer (HTL) of the second emission layer 520 and the thickness of the emitting material layer (EML) of the second emission layer 520, the third thickness (t3) of the third emission layer 530 is larger than the second thickness (t2) of the second emission layer 520.

Meanwhile, even if the third thickness (t3) of the third emission layer 530 is smaller than the first thickness (t1) of the first emission layer 510, the thickness of the hole injecting layer (HIL) of the third emission layer 530 may be larger than the thickness of the hole injecting layer (HIL) of the first emission layer 510. Also, the hole transporting layer (HTL) may have the same thickness in all the emission layers 510, 520 and 530.

The electron transporting layer (ETL) may have the same thickness in all the emission layers 510, 520 and 530, and the electron injecting layer (EIL) may have the same thickness in all the emission layers 510, 520 and 530. The electron transporting layer (ETL) and the electron injecting layer (EIL) may be formed by a deposition process instead of the solution process. In this case, the electron transporting layer (ETL) and the electron injecting layer (EIL) may be deposited without using a mask for covering the bank 400, whereby the electron transporting layer (ETL) and the electron injecting layer (EIL) may be formed on the upper surface of the bank 400.

The respective emission layers 510, 520 and 530 may be formed on the respective emission areas (E1, E2, E3) by an inkjet process without a mask. In this case, a height of an upper end of each of the first to third emission layers 510, 520 and 530 in the center of the emission area (E1, E2, E3) after a drying process of drying the solution for forming the first to third emission layers 510, 520 and 530 is lower than a height of an upper end of each of the first to third emission layers 510, 520 and 530 at the edge of the emission area (E1, E2, E3), and more particularly, at the edge of the emission area (E1, E2, E3) being adjacent to the bank 400. A respective thickness or height (t1, t2, t3) may be a perpendicular distance between the first electrode (310, 320, and 330) and the second electrode (600) in a center of the emission area (E1, E2, and E3). In other words, the respective thickness or height (t1, t2, t3) may be the shortest perpendicular distance between the first electrode (310, 320 and 330) and the second electrode (600) in the emission area (E1, E2, and E3). Another thickness or height may be a perpendicular distance between the first electrode (310, 320, and 330) and the second electrode (600) at a side of the emission area (E1, E2, and E3). In other words, the another thickness or height may be the longest perpendicular distance between the first electrode (310, 320, and 330) and the second electrode (600) in the emission area (E1, E2, and E3). Throughout this disclosure, the terms thickness, height and distance may be used interchangeably. As shown in the drawings, as the height of the first to third emission layers 510, 520 and 530 is gradually lowered from the end of the emission area (E1, E2, E3) being in contact with the bank 400 to the center of the emission area (E1, E2, E3), it is possible to realize a gradually-lowered profile shape. Accordingly, a portion of a second electrode 600 formed on the first to third emission layers 510, 520 and 530 may have a profile corresponding to the profile of the first to third emission layers 510, 520 and 530.

The second electrode 600 is formed on each of the first to third emission layers 510, 520 and 530. The second electrode 600 may function as a cathode of the electroluminescent display device. As the second electrode 600 is formed on the bank 400 as well as the first to third emission layers 510, 520 and 530, the second electrode 600 is formed in the plurality of pixels, and also formed in the boundary area between each of the plurality of pixels. Thus, the second electrode 600 may function as a common electrode for applying a common voltage to the plurality of pixels. If the electroluminescent display device according to one aspect of the present disclosure is formed as a top emission type, the second electrode 600 may be formed of a transparent conductive material for upwardly advancing light emitted from the first to third emission layers 510, 520 and 530, or may be formed to have a small thickness so as to improve transmittance.

Although not shown in detail, an encapsulation layer may be additionally formed on the second electrode 600. The encapsulation layer prevents external moisture from being permeated into the first to third emission layers 510, 520 and 530. The encapsulation layer may be formed of an inorganic insulating material, or may be formed in a deposition structure obtained by alternately depositing an inorganic insulating material and an organic insulating material, but is not limited to these structures.

Figure 3:
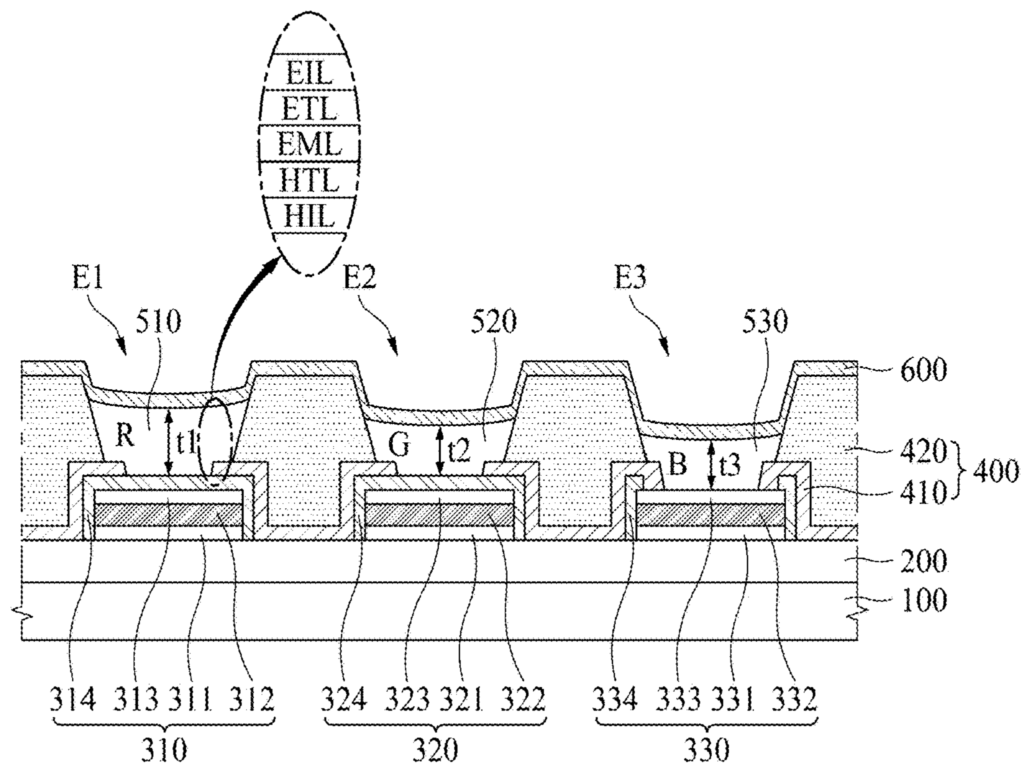
FIG. 3 is a cross-sectional view illustrating an electroluminescent display device according to another aspect of the present disclosure.

FIG. 3 is a cross-sectional view illustrating an electroluminescent display device according to another aspect of the present disclosure. Except for a differing structure of a bank 400, the electroluminescent display device of FIG. 3 is identical in structure to the electroluminescent display device of FIG. 2, whereby the same reference numbers will be used throughout the drawings to refer to the same parts. Hereinafter, only the different structures will be described in detail as follows.

Referring to FIG. 3, a bank 400 includes a first bank 410 and a second bank 420.

The first bank 410 covers an end of a first electrode 310, 320, 330, and the first bank 410 is formed on a circuit device layer 200. A thickness of the first bank 410 is relatively smaller than a thickness of the second bank 420, and a width of the first bank 410 is relatively larger than a width of the second bank 420. In the same manner as described above, the first bank 410 having the above structure has the hydrophilic property. The first bank 410 having the hydrophilic property may be formed of an inorganic insulating material such as silicon oxide. Thus, when the first to third emission layers 510, 520 and 530 are formed by a solution process, a solution for forming the first to third emission layers 510, 520 and 530 may spread easily on the first bank 410.

The second bank 420 is formed on the first bank 410. The width of the second bank 420 is smaller than the width of the first bank 410. The second bank 420 may be obtained by coating a mixture solution of an organic insulating material having the hydrophilic property and a hydrophobic material such as fluorine, and patterning the coated mixture solution by the use of a photolithography process. In response to the light irradiated in the photolithography process, the hydrophobic material such as fluorine may move to an upper portion of the second bank 420, whereby the upper portion of the second bank 420 has the hydrophobic property, and the remaining portions of the second bank 420 have the hydrophilic property. That is, the lower portion of the second bank 420 which is in contact with the first bank 410 has the hydrophilic property, and the upper portion of the second bank 420 has the hydrophobic property, but the second bank 420 is not limited to this structure. For example, the entire portions of the second bank 420 may have the hydrophobic property.

Herein, spreadability of the solution for forming the first to third emission layers 510, 520 and 530 may be improved owing to the first bank 410 having the hydrophilic property and the lower portion of the second bank 420 having the hydrophilic property. As the first bank 410 has the relatively smaller thickness and the relatively larger width in comparison to the second bank 420, it is possible to prepare a 2-step structure of the hydrophilic property by the combination of the first bank 410 and second bank 420, whereby the solution for forming the first to third emission layers 510, 520 and 530 may easily spread to the left and right ends of the emission area (E1, E2, E3).

Also, the upper portion of the second bank 420 having the hydrophobic property prevents the solution for forming the corresponding first to third emission layers 510, 520 and 530 from spreading to another neighboring emission area (E1, E2, E3) so that it is possible to prevent the corresponding first to third emission layers 510, 520 and 530 from being mixed with the emission layer of another neighboring emission area (E1, E2, E3).

Figure 4:
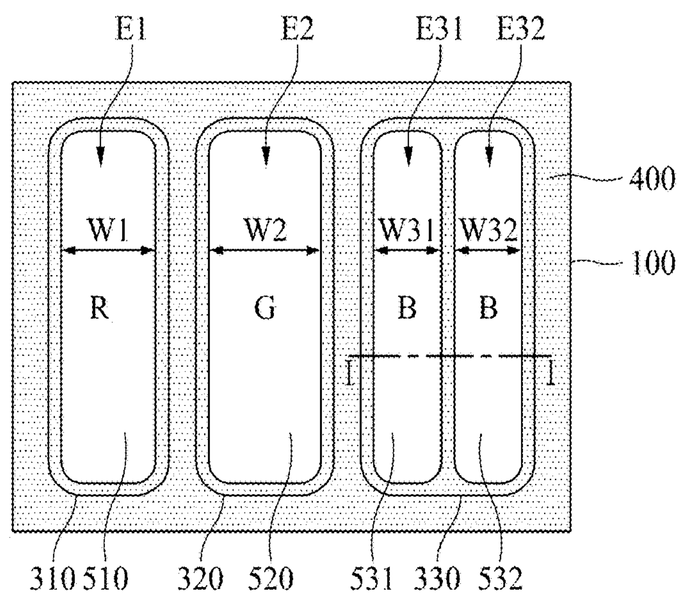
FIG. 4 is a plane view illustrating an electroluminescent display device according to another aspect of the present disclosure.

FIG. 4 is a plane view illustrating an electroluminescent display device according to another aspect of the present disclosure.

As shown in FIG. 4, the electroluminescent display device according to the another aspect of the present disclosure may include a substrate 100, a plurality of first electrodes 310, 320 and 330, a bank 400, a first emission layer 510, a second emission layer 520, and a third emission layer 531 and 532.

The plurality of first electrodes 310, 320 and 330 may be patterned on each pixel. The plurality of first electrodes 310, 320 and 330 may include the first electrode 310 overlapped with a first emission area (E1), the first electrode 320 overlapped with a second emission area (E2), and the first electrode 330 overlapped with a third emission layer (E31, E32).

The first electrode 310 overlapped with the first emission area (E1) has a relatively large area in comparison to the first emission area (E1), and the first electrode 310 overlapped with the first emission area (E1) may be formed in a shape corresponding to the first emission area (E1). The first electrode 320 overlapped with the second emission area (E2) has a relatively large area in comparison to the second emission area (E2), and the first electrode 320 overlapped with the second emission area (E2) may be formed in a shape corresponding to the second emission area (E2).

The first electrode 330 overlapped with the third emission area (E3) has a relatively large area in comparison to the third emission area (E31, E32). The first electrode 330 overlapped with the third emission area (E31, E32) may also be overlapped with an area separating the first sub emission area (E31) and the second sub emission area (E32) included in the third emission area (E31, E32).

The bank 400 is formed in a matrix configuration on the substrate 100, to thereby define the plurality of emission areas (E1, E2, E31, and E32). The bank 400 is formed in the boundary area between each of the first emission area (E1), the second emission area (E2), and the third emission area (E31, E32). Also, the bank 400 is formed in the area separating the first sub emission area (E31) and the second sub emission area (E32) included in the third emission area (E31, E32), to thereby define the plurality of sub emission areas (E31, E32) by the use of bank 400.

A width (W1) in a first direction of the first emission area (E1) is smaller than a width (W2) in the first direction of the second emission area (E2), and the width (W2) in a first direction of the second emission area (E2) may be smaller than a total value obtained by adding a width (W31) in a first direction of the first sub emission area (E31) for the third emission area (E31, E32) and a width (W32) in a first direction of the second sub emission area (E32) for the third emission area (E31, E32). The widths (W1, W2, W31, and W32) correspond to widths in a short-axis direction of each emission area (E1, E2, E31, and E32).

An efficiency of the second emission layer 520 having the green (G) emitting layer is lower than an efficiency of the first emission layer 510 having the red (R) emitting layer. In order to realize the relatively large size of the second emission area (E2) in comparison to the first emission area (E1), the width (W2) in the first direction of the second emission area (E2) is larger than the width (W1) in the first direction of the first emission area (E1). Also, an efficiency of the third emission layer 530 having the blue (B) emission layer is lower than an efficiency of the second emission layer 520 having the green (G) emission layer. Thus, in order to realize the relatively large size of the third emission area (E31, E32) in comparison to the second emission area (E2), a total value obtained by adding the width (W31) in the first direction of the first sub emission area (E31) for the third emission area (E31, E32) and the width (W32) in the first direction of the second sub emission area (E32) for the third emission area (E31, E32) is larger than the width (W2) in the first direction of the second emission area (E2).

In this case, the same value of the width (W31) in the first direction of the first sub emission area (E31) for the third emission area (E31, E32) and the width (W32) in the first direction of the second sub emission area (E32) for the third emission area (E31, E32) is favorable to give the same profile both in the first sub emission layer 531 and the second sub emission layer 532 for the third emission layer 531 and 532.

The first emission layer 510 is formed in the first emission area (E1) defined by the bank 400, and is configured to emit red (R) light. The second emission layer 520 is formed in the second emission area (E2) defined by the bank 400, and is configured to emit green (G) light.

The third emission layer 531 and 532 is formed in the third emission area (E31, E32) defined by the bank 400. In detail, the first sub emission layer 531 of the third emission layer 531 and 532 is formed in the first sub emission area (E31) of the third emission area (E31, E32), and the second sub emission layer 532 of the third emission layer 531 and 532 is formed in the second sub emission area (E32) of the third emission area (E31, E32). As the first sub emission area (E31) and the second sub emission area (E32) are separated from each other, the first sub emission layer 531 and the second sub emission layer 532 may be separated from each other. The first sub emission layer 531 and the second sub emission layer 532 are configured to emit the same-colored light, for example, blue (B) light. Also, the first sub emission layer 531 and the second sub emission layer 532 are configured to emit the light at the same time in accordance with an electric field formed by the first electrode 330 provided below the first and second sub emission layers 531 and 532 and the second electrode provided above the first and second sub emission layers 531 and 532. That is, the first sub emission layer 531 and the second sub emission layer 532 included in the third emission layer 531 and 532 are configured to emit the light at the same time by the driving of the same circuit device.

According to another aspect of the present disclosure, the third emission layer 531 and 532 having the blue (B) emission layer is formed of the first sub emission layer 531 and the second sub emission layer 532 separated from each other so that it is possible to realize a uniform profile of the third emission layer 531 and 532, and thus, to overcome a problem related with a dark spot in the third emission area (E31, E32). As described above, the thickness of the blue emission layer is smaller than the thickness of the red emission layer, and the area of the blue emission layer is larger than the area of the red emission layer. Thus, if providing the blue emission layer having the relatively large area and the relatively small thickness, a profile of the blue emission layer may be not uniform. In order to overcome this problem, according to another aspect of the present disclosure, the third emission layer 531 and 532 having the blue (B) emission layer is provided with the first sub emission layer 531 and the second sub emission layer 532 separated from each other so that it is possible to decrease the area for each of the first sub emission layer 531 and the second sub emission layer 532. Thus, when the first sub emission layer 531 and the second sub emission layer 532 are formed by the solution process, it is possible to realize the uniform profile in each of the first and second sub emission layers 531 and 532.

Figure 5:
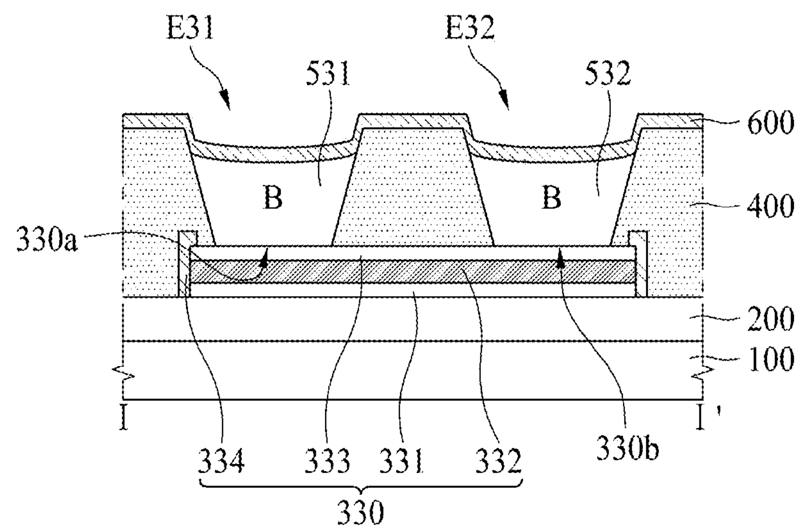
FIG. 5 is a cross-sectional view along line I-I of FIG. 4.

FIG. 5 is a cross-sectional view along line I-I of FIG. 4.

As shown in FIG. 5, a circuit device layer 200 is formed on a substrate 100, and a first electrode 330 is formed on the circuit device layer 200. The first electrode 330 includes a third lower layer 331, a third middle layer 332, a third upper layer 333, and a third cover layer 334, as described above.

A bank 400 is formed on the circuit device layer 200, and is configured to cover an edge of the first electrode 330. The bank 400 is additionally formed between a first sub emission area (E31) and a second sub emission area (E32), whereby the first sub emission area (E31) and the second sub emission area (E32) are separated from each other by the bank 400. Thus, a first portion 330*a* of the first electrode 330, which is not covered by the bank 400, is exposed to the first sub emission area (E31), and a second portion 330*b* of the first electrode 330, which is not covered by the bank 400, is exposed to the second sub emission area (E32). The first portion 330*a* of the first electrode 330, which is exposed without being covered by the bank 400, and the second portion 330*b* of the first electrode 330, which is exposed without being covered by the bank 400, are separated from each other under the circumstances that the bank 400 is interposed in-between.

A predetermined portion of the bank 400 for covering the edge of the first electrode 330 is in contact with the third cover layer 334, and a predetermined portion of the bank 400 additionally provided between the first sub emission area (E31) and the second sub emission area (E32) is in contact with the third upper layer 333.

The first sub emission layer 531 is formed in the first sub emission area (E31), and the second sub emission layer 532 is formed in the second sub emission area (E32). The first sub emission layer 531 and the second sub emission layer 532 are formed on one first electrode 330, whereby the first sub emission layer 531 and the second sub emission layer 532 are configured to emit the light at the same time.

The second electrode 600 is formed on an upper surface of the first and second sub emission layers 531 and 532, and an upper surface of the bank 400.

Figure 6:
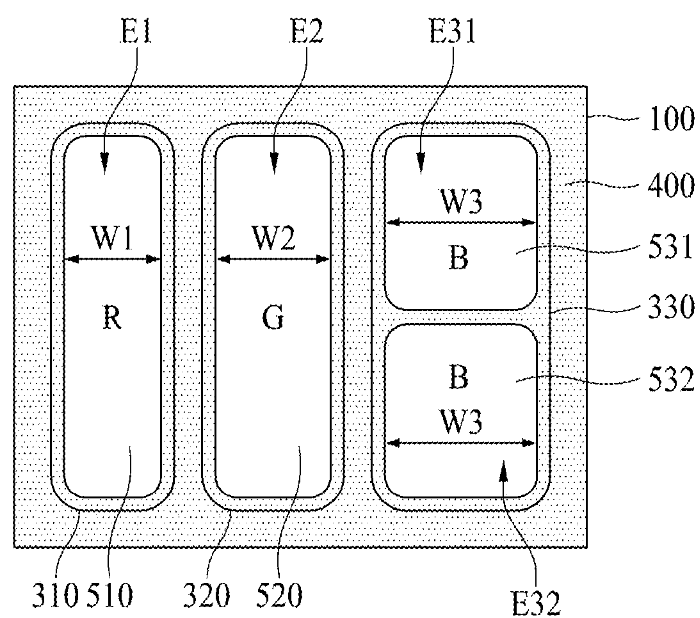
FIG. 6 is a plane view illustrating an electroluminescent display device according to another aspect of the present disclosure.

FIG. 6 is a plane view illustrating an electroluminescent display device according to another aspect of the present disclosure. Except for a differing structure of a third emission area (E31, E32) and a third emission layer 531 and 532, the electroluminescent display device of FIG. 6 is identical in structure to the electroluminescent display device of FIG. 4. Accordingly, only the different structures will be described in detail as follows.

In the above description of FIG. 4, the third emission area (E31, E32) and the third emission layer 531 and 532 are separated from each other in the horizontal direction. That is, the portion of the bank 400 formed between first sub emission area (E31) and the second sub emission area (E32) and between the first sub emission layer 531 and the second sub emission layer 532 is formed in the long-axis direction of the third emission area (E31, E32) and the third emission layer 531 and 532.

Meanwhile, in the case of FIG. 6, each of the third emission area (E31, E32) and the third emission layer 531 and 532 is separated from each other in the vertical direction. That is, the portion of the bank 400 formed between first sub emission area (E31) and the second sub emission area (E32) and between the first sub emission layer 531 and the second sub emission layer 532 is formed in the short-axis direction of the third emission area (E31, E32) and the third emission layer 531 and 532. Thus, a width (W3) in a first direction of the first sub emission layer 531 is identical to a width (W3) in a first direction of the second sub emission layer 532, and the width (W3) is larger than a width (W1) in a first direction of the first emission layer 510 and a width (W2) in a first direction of the second emission layer 520.

Figure 7:
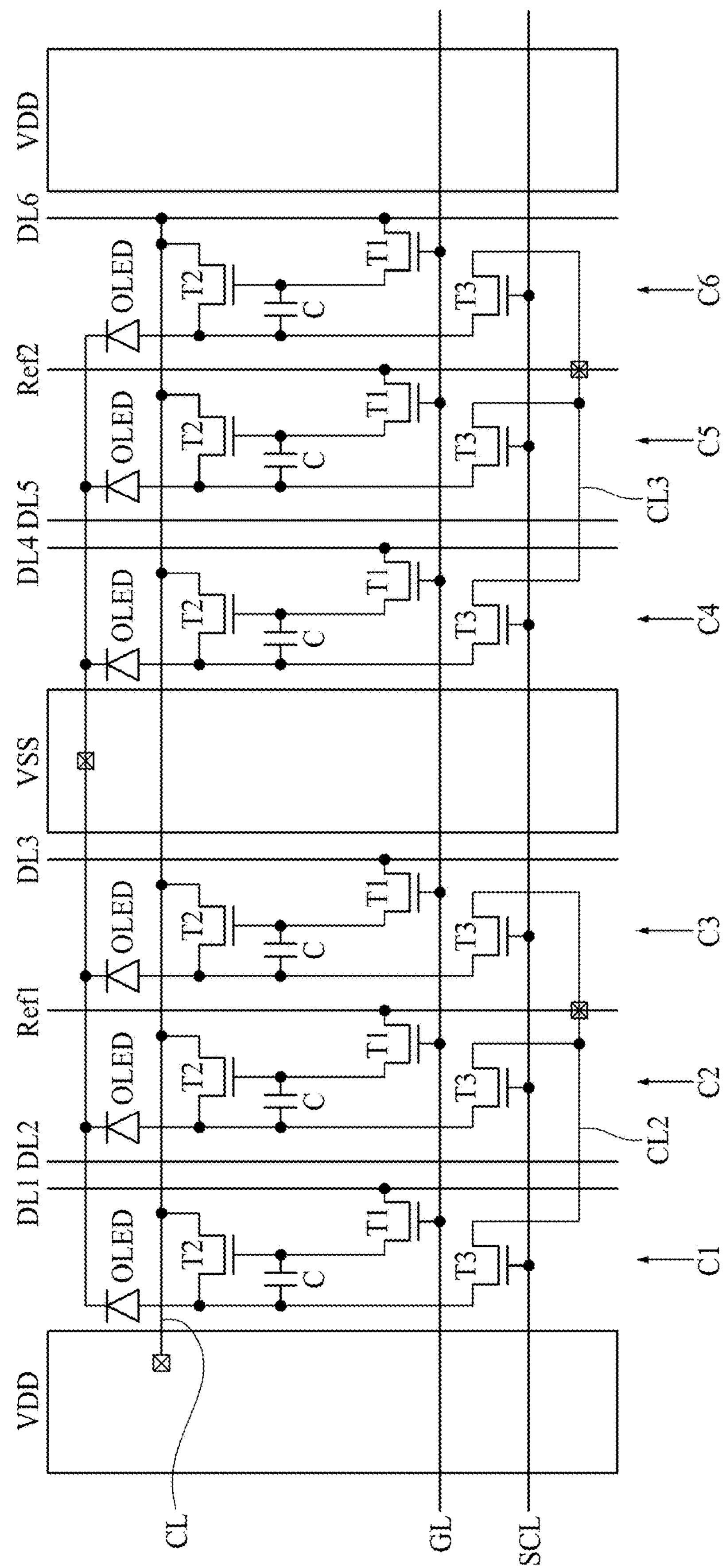
FIG. 7 is a circuit diagram illustrating an electroluminescent display device according to one aspect of the present disclosure.
Figure 8:
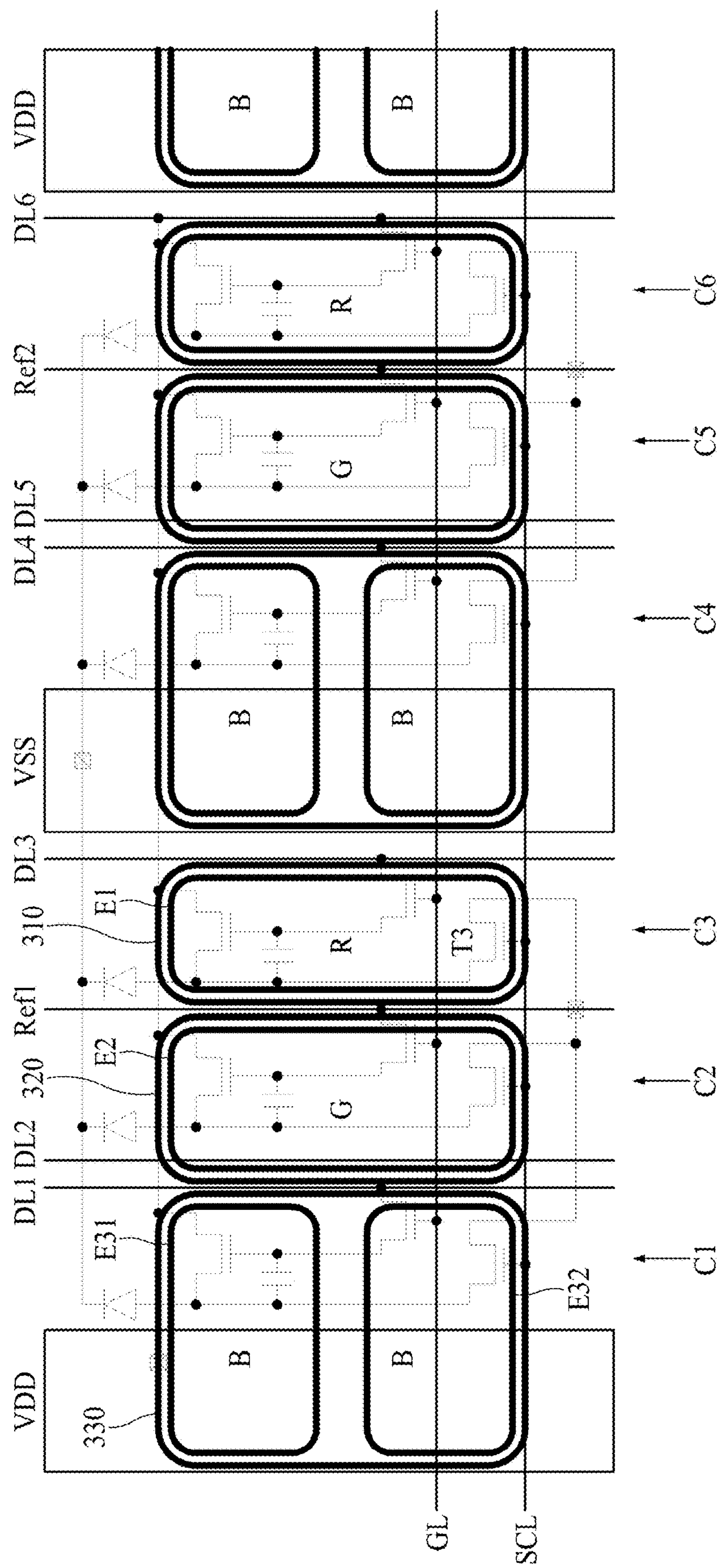
FIG. 8 and FIG. 9 are plane views illustrating electroluminescent display devices according to various aspects of the present disclosure, which show a plurality of emission areas arranged in a circuit structure of FIG. 7.
Figure 9:
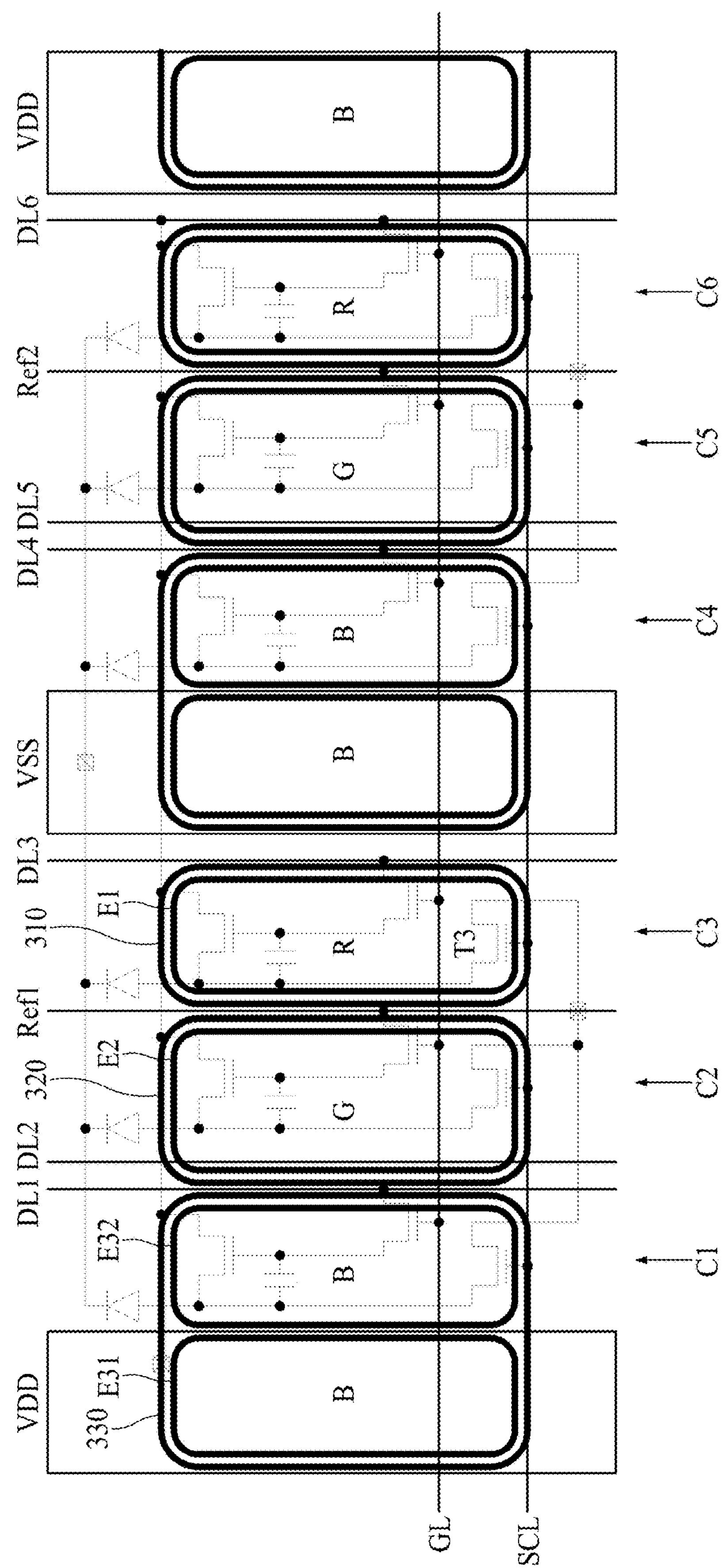

FIG. 7 is a circuit diagram illustrating an electroluminescent display device according to one aspect of the present disclosure. FIGS. 8 and 9 are plane views illustrating electroluminescent display devices according to various aspects of the present disclosure, which show a plurality of emission areas arranged in a circuit structure of FIG. 7.

As shown in FIG. 7, the electroluminescent display device according to one aspect of the present disclosure includes a gate line (GL), a sensing control line (SCL), a high power line (VDD), a low power line (VSS), a data line (DL1, DL2, DL3, DL4, DL5, DL6), a reference line (Ref1, Ref2), a switching thin film transistor (T1), a driving thin film transistor (T2), a sensing thin film transistor (T3), a capacitor (C), and an organic light emitting device (OLED).

The gate line (GL) is arranged in a horizontal direction. The gate line (GL) supplies a gate signal to a gate terminal of the switching thin film transistor (T1) provided in each circuit device column (C1, C2, C3, C4, C5, C6).

The sensing control line (SCL) is provided at a predetermined interval from the gate line (GL), and is arranged in the horizontal direction while being parallel to the gate line (GL). The sensing control line (SCL) supplies a sensing control signal to a gate terminal of the sensing thin film transistor (T3) provided in each circuit device column (C1, C2, C3, C4, C5, C6).

The high power line (VDD) is arranged in a vertical direction while being perpendicular to the gate line (GL) and the sensing control line (SCL). The high power line (VDD) supplies high power to a drain terminal of the driving thin film transistor (T2) provided in each circuit device column (C1, C2, C3, C4, C5, C6).

According to one aspect of the present disclosure, one high power line (VDD) supplies high power to a drain terminal of the driving thin film transistor (T2) provided in each of the six circuit device columns (C1, C2, C3, C4, C5, C6) at the same time. Thus, a first connection line (CL, CL1) is provided to connect one high power line (VDD) with the drain terminal of each driving thin film transistor (T2). The first connection line (CL, CL1) extends in a horizontal direction from one high power line (VDD) to the sixth circuit device column (C6) via the first to third circuit device columns (C1, C2, C3), the low power line (VSS), and the fourth and fifth circuit device columns (C4, C5) in sequence. Thus, the first connection (CL, CL1) is connected with the high power line (VDD), and is also connected with the drain terminal of the driving thin film transistor (T2) provided in each circuit device column (C1, C2, C3, C4, C5, C6).

The low power line (VSS) is arranged in a vertical direction while being parallel to the high power line (VDD). The low power line (VSS) supplies low power to a cathode of the organic light emitting device (OLED). As the cathode is formed on an entire surface of a substrate, there is no need for a connection line such as the aforementioned first connection line (CL, CL1) so as to connect the low power line (VSS) with the cathode of the individual organic light emitting device (OLED). In detail, the cathode formed on the entire surface of the substrate is connected with the low power line (VSS) via a predetermined contact hole. Thus, the line extending from the individual organic light emitting device (OLED) to the low power line (VSS), which is shown in the drawings, is provided only to show the electrical connection between the cathode of the organic light emitting device (OLED) and the low power line (VSS). In practice, there is no need for the line extending from the individual organic light emitting device (OLED) to the low power line (VSS).

A left-to-right width of the high power line (VDD) and a left-to-right width of the low power line (VSS) are larger than a left-to-right width of the data line (DL1, DL2, DL3, DL4, DL5, DL6). The high power line (VDD) and the low power line (VSS) may be periodically formed by each cycle corresponding to a plurality of pixels instead of being formed by each individual pixel. If the high power line (VDD) and the low power line (VSS) are periodically formed by each cycle of the plurality of pixels, each of the left-to-right width of the high power line (VDD) and the left-to-right width of the low power line (VSS) is larger than a left-to-right width of the data line (DL1, DL2, DL3, DL4, DL5, DL6) formed by each individual pixel so as to realize a stable power supply. The left-to-right width of each of the high power line (VDD), the low power line (VSS), and the data line (DL1, DL2, DL3, DL4, DL5, DL6) indicates the width in a direction perpendicular to a length direction of each of the high power line (VDD), the low power line (VSS), and the data line (DL1, DL2, DL3, DL4, DL5, DL6).

The data line (DL1, DL2, DL3, DL4, DL5, DL6) is arranged in the vertical direction. The data line (DL1, DL2, DL3, DL4, DL5, DL6) is formed between the high power line (VDD) and the low power line (VSS).

The data line (DL1, DL2, DL3, DL4, DL5, DL6) may include the first data line (DL1), the second data line (DL2), the third data line (DL3), the fourth data line (DL4), the fifth data line (DL5), and/or the sixth data line (DL6).

The first data line (DL1) has the high power line (VDD) at its left side, and also has the second data line (DL2) at its right side. In this case, the first data line (DL1) and the high power line (VDD) are provided at a predetermined interval from each other. However, the first data line (DL1) and the second data line (DL2) are positioned adjacent to each other. In detail, the first circuit device column (C1) having circuit devices such as the switching thin film transistor (T1), the driving thin film transistor (T2), the sensing thin film transistor (T3), and the capacitor (C) is formed between the first data line (DL1) and the high power line (VDD). However, the circuit device column (C1, C2, C3) having the above circuit device is not formed between the first data line (DL1) and the second data line (DL2). In this present disclosure, if any one line is provided adjacent to another line, it indicates that the circuit device is not formed therebetween.

The second data line (DL2) is provided adjacent to the first data line (DL1) that is at its left side, and the second data line (DL2) is provided at a predetermined interval from the first reference line (Ref1) that is at its right side under the condition that the second circuit device column (C2) is positioned in-between. The third data line (DL3) is provided at a predetermined interval from the first reference line (Ref1) that is at its left side under the condition that the third circuit device column (C3) is positioned in-between, and the third data line (DL3) is positioned adjacent to the low power line (VSS) that is at its right side. The fourth data line (DL4) is provided at a predetermined interval from the low power line (VSS) that is at its left side under the condition that the fourth circuit device column (C4) is positioned in-between, and the fourth data line (DL4) is provided adjacent to the fifth data line (DL5) that is at its right side. The fifth data line (DL5) is provided adjacent to the fourth data line (DL4) that is at its left side, and is provided at a predetermined interval from the second reference line (Ref2) under the condition that the fifth circuit device column (C5) is positioned in-between. The sixth data line (DL6) is provided at a predetermined interval from the second reference line (Ref2) that is at its left side under the condition that the sixth circuit device column (C6) is positioned in-between, and the sixth data line (DL6) is provided at a predetermined interval from another high power line (VDD) that is at its right side.

At least one data line (DL1, DL2, DL3, DL4, DL5, DL6) may extend in a first direction, the at least one data line being disposed between the first emission area (E1) and the second emission area (E3), wherein a portion of the bank (400) extends between the first emission area and the second emission area in the first direction, the portion of the bank (400) overlapping the at least one data line.

At least one data line (DL1, DL2, DL3, DL4, DL5, DL6) may extend in a first direction, the at least one data line being disposed between the first emission area (E1) and the second emission area (E3), wherein a portion of the second bank (420) extends between the first emission area and the second emission area in the first direction, the portion of the second bank (420) overlapping the at least one data line.

The data line (DL1, DL2, DL3, DL4, DL5, DL6) supplies a data voltage to a source terminal of the switching thin film transistor (T1) provided in each circuit device column (C1, C2, C3, C4, C5, C6).

The reference line (Ref1, Ref2) is arranged in the vertical direction between the high power line (VDD) and the low power line (VSS). The reference line (Ref1, Ref2) may include the first reference line (Ref1) and/or the second reference line (Ref2).

The first reference line (Ref1) is provided at a predetermined interval from the second data line (DL2) that is at its left side under the condition that the second circuit device column (C2) is positioned in-between, and the first reference line (Ref1) is provided at a predetermined interval from the third data line (DL3) that is at its right side under the condition that the third circuit device column (C3) is positioned in-between.

The second reference line (Ref2) is provided at a predetermined interval from the fifth data line (DL5) that is at its left side under the condition that the fifth circuit device column (C5) is positioned in-between, and the second reference line (Ref2) is provided at a predetermined interval from the sixth data line (DL6) that is at its right side under the condition that the sixth circuit device column (C6) is positioned in-between.

The reference line (Ref1, Ref2) is connected with a drain terminal of the sensing thin film transistor (T3) provided in each circuit device column (C1, C2, C3, C4, C5, C6).

According to one aspect of the present disclosure, the first reference line (Ref1) is connected with the drain terminal of the sensing thin film transistor (T3) provided in each of the three circuit device columns (C1, C2, C3). Thus, a second connection line (CL2) is formed to connect the first reference line (Ref1) with the drain terminal in each sensing thin film transistor (T3). The second connection line (CL2)

extends in a leftward direction with respect to the first reference line (Ref1) to the first circuit device column (C1) via the second circuit device column (C2), and also extends in a rightward direction to the third circuit device column (C3). Thus, the second connection line (CL2) is connected with the first reference line (Ref1), and is also connected with the drain terminal of the sensing thin film transistor (T3) provided in each circuit device column (C1, C2, C3).

Similarly, the second reference line (Ref2) is connected with the drain terminal of the sensing thin film transistor (T3) provided in each of the three circuit device columns (C4, C5, C6). Thus, a third connection line (CL3) is formed to connect the second reference line (Ref2) with the drain terminal in each sensing thin film transistor (T3). The third connection line (CL3) extends in a leftward direction with respect to the second reference line (Ref2) to the fourth circuit device column (C4) via the fifth circuit device column (C5), and also extends in a rightward direction to the sixth circuit device column (C6). Thus, the third connection line (CL3) is connected with the second reference line (Ref2), and is also connected with the drain terminal of the sensing thin film transistor (T3) provided in each circuit device column (C4, C5, C6).

The switching thin film transistor (T1), the driving thin film transistor (T2), the sensing thin film transistor (T3), and the capacitor (C) are provided in each circuit device column (C1, C,2 C3, C4, C5, C6).

As the switching thin film transistor (T1) is switched in accordance with a gate signal supplied to the gate line (GL), a data voltage provided from the data line (D1, D2, D3, D4, D5, D6) is supplied to the driving thin film transistor (T2) by the use of switching thin film transistor.

As the driving thin film transistor (T2) is switched in accordance with the data voltage supplied from the switching thin film transistor (T1), a data current is generated by power supplied from the high power line (VDD), and the generated data current is supplied to the organic light emitting device (OLED).

The sensing thin film transistor (T3) senses a threshold voltage deviation of the driving thin film transistor (T2), which causes a deterioration of picture quality. The threshold voltage deviation may be sensed for a sensing mode. The sensing thin film transistor (T3) supplies a voltage of the driving thin film transistor (T2) to the reference line (Ref1, Ref2) in response to a sensing control signal supplied from the sensing control line (SCL).

The capacitor (C) maintains the data voltage supplied to the driving thin film transistor (T2) for one frame period. The capacitor (C) is connected with each of gate and source terminals of the driving thin film transistor (T2).

The organic light emitting device (OLED) emits a predetermined amount of light in accordance with the data current supplied from the driving thin film transistor (T2). The organic light emitting device (OLED) includes an anode, a cathode, and an emitting layer provided between the anode and the cathode. The anode of the organic light emitting device (OLED) is connected with the source terminal of the driving thin film transistor (T2), and the cathode of the organic light emitting device (OLED) is connected with the low power line (VSS).

A structure of the first circuit device column (C1) may be identical to a structure of the fourth circuit device column (C4). That is, an arrangement structure of the thin film transistors (T1, T2, T3) and the capacitor (C) included in the first circuit device column (C1) may be identical to an arrangement structure of the thin film transistors (T1, T2, T3) and the capacitor (C) included in the fourth circuit device column (C4). Also, a structure of the second circuit device column (C2) may identical to a structure of the fifth circuit device column (C5). Also, a structure of the third circuit device column (C3) may be identical to a structure of the sixth circuit device column (C6).

According to one aspect of the present disclosure, the structure shown in FIG. 7 may be one unit, and the structure shown in FIG. 7 may be repetitively provided on the substrate. That is, the total six circuit device columns (C1, C2, C3, C4, C5, C6) may be formed to use one high power line (VDD) and one low power line (VSS). It is possible to form the circuit device columns with more than six or fewer than six circuit device columns (C1, C2, C3, C4, C5, C6) by the use of one high power line (VDD) and one low power line (VSS).

As described above, considering that the structure of the first circuit device column (C1) is identical to the structure of the fourth circuit device column (C4), the left-to-right width of the high power line (VDD) adjacent to the left side of the first circuit device column (C1) is identical to the left-to-right width of the low power line (VSS) adjacent to the left side of the fourth circuit device column (C4). If the left-to-right width of the high power line (VDD) is different from the left-to-right width of the low power line (VSS), a capacitance between the high power line (VDD) and the circuit device inside the first circuit device column (C1) is different from a capacitance between the low power line (VSS) and the circuit device inside the fourth circuit device column (C4), whereby a property of the circuit device inside the first circuit device column (C1) and a property of the circuit device inside the fourth circuit device column (C4) may be not uniform.

As shown in FIG. 8, according to one aspect of the present disclosure, a first emission area (E1) for emitting red (R) light, a second emission area (E2) for emitting green (G) light, and a third emission area (E31, E32) for emitting blue (B) light are prepared on the circuit structure of FIG. 7.

The first emission area (E1) and the first electrode 310 overlapped with the first emission area (E1) may be overlapped with the third circuit device column (C3). Also, the first emission area (E1) and the first electrode 310 overlapped with the first emission area (E1) may be overlapped with the sixth circuit device column (C6). Specifically, the first emission area (E1) and the first electrode 310 may be overlapped with a switching thin film transistor (T1), a driving thin film transistor (T2), a sensing thin film transistor (T3), and a capacitor (C) provided in each of the third circuit device column (C3) and the sixth circuit device column (C6).

The second emission area (E2) and the first electrode 320 overlapped with the second emission area (E2) may be overlapped with the second circuit device column (C2). Also, the second emission area (E2) and the first electrode 320 overlapped with the second emission area (E2) may be overlapped with the fifth circuit device column (C5). Specifically, the second emission area (E2) and the first electrode 320 may be overlapped with a switching thin film transistor (T1), a driving thin film transistor (T2), a sensing thin film transistor (T3), and a capacitor (C) provided in each of the second circuit device column (C2) and the fifth circuit device column (C5).

The third emission area (E31, E32) and the first electrode 330 overlapped with the third emission area (E31, E32) may be overlapped with the first circuit device column (C1) and the high power line (VDD). Also, the third emission area (E31, E32) and the first electrode 330 overlapped with the third emission area (E31, E32) may be overlapped with the fourth circuit device column (C4) and the low power line (VSS). Specifically, the third emission area (E31, E32) and the first electrode 330 may be overlapped with a switching thin film transistor (T1), a driving thin film transistor (T2), a sensing thin film transistor (T3), and a capacitor (C) provided in each of the first circuit device column (C1) and the fourth circuit device column (C4).

Except for a differing structure of a third emission area (E31, E32), the electroluminescent display device of FIG. 9 is identical in structure to the electroluminescent display device of FIG. 8, whereby only the different structures will be described in detail as follows.

As described in the above FIG. 8, the first sub emission area (E31) and the second sub emission area (E32) included in the third emission area (E31, E32) are separated from each other in a vertical direction, whereby the first sub emission area (E31) and the second sub emission area (E32) are respectively overlapped with the first circuit device column (C1) and the high power line (VDD), and also overlapped with the fourth circuit device column (C4) and the low power line (VSS).

Meanwhile, as shown in FIG. 9, first and second sub emission areas (E31, E32) included in the third emission area (E31, E32) are separated from each other in a horizontal direction, whereby the first sub emission areas (E31) of different pixels are overlapped with the high power line (VDD) in a first pixel and the low power line (VSS) in a second pixel, but are not overlapped with the first circuit device column (C1) and the fourth circuit device column (C4), and the second sub emission areas (E32) of different pixels are overlapped with the first circuit device column (C1) in a first pixel and the fourth circuit device column (C4) in a second pixel, but are not overlapped with the high power line (VDD) and the low power line (VSS). A left-to-right width of the first sub emission area (E31) is the same as or less than a width of the high power line (VDD) and a width of the low power line (VSS).

In case of FIG. 9, as the first sub emission areas (E31) of different pixels are overlapped with the high power line (VDD) in the first pixel and the low power line (VSS) in the second pixel, it is possible to decrease a step difference in a lower layer of the first sub emission areas (E31), whereby it is possible to realize the uniform profile in the first sub emission layer 531 formed in the first sub emission areas (E31).

Meanwhile, although not shown, the structure of the first to third emission layers 510, 520 and 530, the plurality of first electrodes 310, 320 and 330, the bank 400, and the emission area (E1, E2, E3), as shown in FIG. 2 or FIG. 3, may be arranged in the circuit structure shown in FIG. 7.

Figure 10:
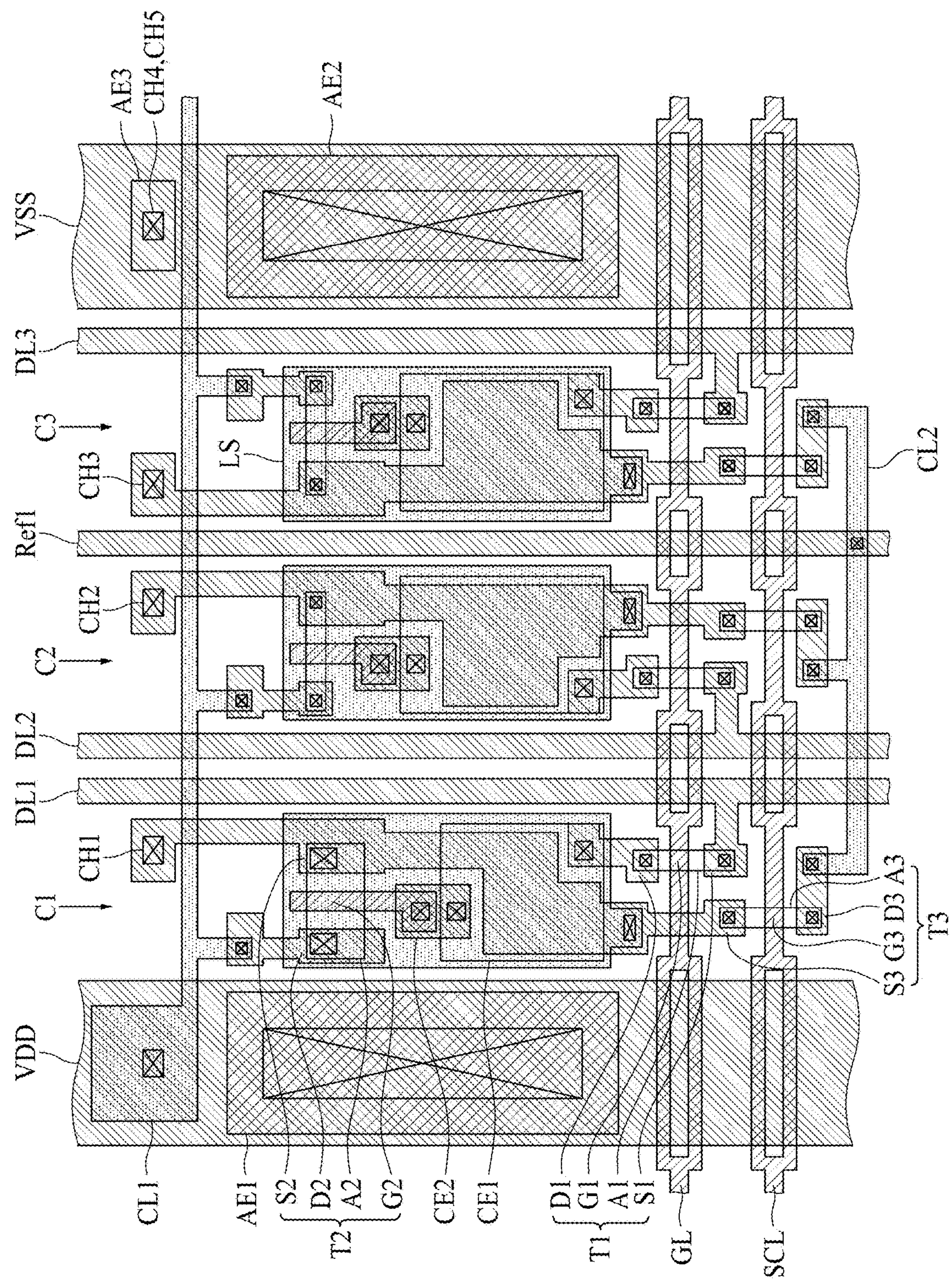
FIG. 10 is a plane view illustrating an electroluminescent display device according to one aspect of the present disclosure, which has a circuit structure of FIG. 7.

FIG. 10 is a plane view illustrating an electroluminescent display device according to one aspect of the present disclosure, which has a circuit structure corresponding to that of FIG. 7. In FIG. 10, a structure of the fourth to sixth circuit device columns (C4, C5, C6) shown in FIG. 7 will be omitted.

As shown in FIG. 10, a gate line (GL) and a sensing control line (SCL) are arranged in a horizontal direction, and a high power line (VDD), a low power line (VSS), a data line (DL1, DL2, DL3), and a first reference line (Ref1) are arranged in a vertical direction.

The gate line (GL) and the sensing control line (SCL) are positioned in the same layer, and are formed of the same material. The high power line (VDD), the low power line (VSS), the data line (DL1, DL2, DL3), and the first reference line (Ref1) are positioned in the same layer, and are formed of the same material. A detailed structure of each line is the same as that of FIG. 7, whereby a detailed description for the same parts will be omitted.

A first circuit device column (C1) is prepared between the high power line (VDD) and the first data line (DL1). In the first circuit device column (C1), there are a switching thin film transistor (T1), a driving thin film transistor (T2), and a sensing thin film transistor (T3).

The switching thin film transistor (T1) provided in the first circuit device column (C1) may include a first gate electrode (G1), a first source electrode (S1), a first drain electrode (D1), and a first active layer (A1) The first gate electrode (G1) may be formed of one portion of the gate line (GL), but is not limited to this structure. For example, the first gate electrode (G1) may be formed in a structure diverged from the gate line (GL).

The first source electrode (S1) may be formed in a structure diverged from the first data line (DL1).

The first drain electrode (D1) and the first source electrode (S1) confronting each other are formed in the same layer. The first drain electrode (D1) is connected with a second gate electrode (G2) of the driving thin film transistor (T2) via a connection electrode (CE1, CE2).

The connection electrode (CE1, CE2) may include the first connection electrode (CE1) and the second connection electrode (CE2). The first connection electrode (CE1) is connected with the first drain electrode (D1) via one contact hole (x), and is connected with the second connection electrode (CE2) via another contact hole (x). The first connection electrode (CE1) has a relatively large size so that it is possible to improve a capacitance of the capacitor (C). The second connection electrode (CE2) is connected with each of the first connection electrode (CE1) and the second gate electrode (G2) of the driving thin film transistor (T2) via the individual contact holes (x). The first connection electrode (CE1) is formed in the same layer as the first active layer (A1), and the second connection electrode (CE2) is formed in the same layer as the first source electrode (S1) and the first drain electrode (D1).

The first active layer (A1) is connected with each of the first source electrode (S1) and the first drain electrode (D1) via the individual contact holes (x), whereby the first active layer (A1) functions as an electron shift channel.

The driving thin film transistor (T2) provided in the first circuit device column (C1) may include a second gate electrode (G2), a second source electrode (S2), a second drain electrode (D2), and a second active layer (A2).

As described above, the second gate electrode (G2) may be connected with the first drain electrode (D1) of the switching thin film transistor (T1) via the connection electrode (CE1, CE2). The second gate electrode (G2) and the first gate electrode (G1) may be formed in the same layer.

The second source electrode (S2) confronts with the second drain electrode (D2), and the second source electrode (S2) extends in a low-and-upper (i.e., vertical) direction. The second source electrode (S2) has a relatively large size so that it is possible to improve a capacitance of the capacitor (C). An upper portion of the second source electrode (S2) is connected with an anode of an organic light emitting device in a first pixel via a first contact hole (CH1). A lower portion of the second source electrode (S2) is connected with a third source electrode (S3) of the sensing thin film transistor (T3). The second source electrode (S2) and the third source electrode (S3) may be formed as one body.

The second drain electrode (D2) is connected with the high power line (VDD) via a first connection line (CL1). The first connection line (CL1) is connected with each of the high power line (VDD) and the second drain electrode (D2) via individual contact holes (x). The first connection line (CL1) may be formed in the lowermost layer of a substrate, that is, may be formed right on an upper surface of the substrate. The second source electrode (S2) and the second drain electrode (D2) may be positioned in the same layer as the first source electrode (S1) and the first drain electrode (D1), and may be formed of the same material as those of the first source electrode (S1) and the first drain electrode (D1).

The second active layer (A2) is connected with each of the second source electrode (S2) and the second drain electrode (D2) via the individual contact holes (x), whereby the second active layer (A2) functions as an electron shift channel. The second active layer (A2) and the first active layer (A1) are positioned in the same layer, and are formed of the same material.

The sensing thin film transistor (T3) provided in the first circuit device column (C1) may include a third gate electrode (G3), a third source electrode (S3), a third drain electrode (D3), and a third active layer (A3).

The third gate electrode (G3) may be formed of one portion of the sensing control line (SCL), but is not limited to this structure. For example, the third gate electrode (G3) may be formed in a structure diverged from the sensing control line (SCL).

As described above, the third source electrode (S3) may be formed as one body with the second source electrode (S2) of the driving thin film transistor (T2).

The third drain electrode (D3) and the third source electrode (S3) confronting each other may be formed in the same layer. The third drain electrode (D3) is connected with the first reference line (Ref1) via a second connection line (CL2). The second connection line (CL2) is connected with each of the third drain electrode (D3) and the first reference line (Ref1) via the individual contact holes (x). The second connection line (CL2) may be positioned in the same layer as the first connection line (CL, CL1), and may be formed of the same material as the first connection line (CL, CL1).

The third active layer (A3) is connected with each of the third source electrode (S3) and the third drain electrode (D3) via the individual contact holes (x), whereby the third active layer (A3) functions as an electron shift channel. The third active layer (A3) may be positioned in the same layer as the first active layer (A1), and may be formed of the same material as the first active layer (A1).

Also, a light shielding layer (LS) is formed in the first circuit device column (C1). The light shielding layer (LS) prevents light from being incident on the second active layer (A2) of the driving thin film transistor (T2). Accordingly, the light shielding layer (LS) has a relatively large area in comparison to the second active layer (A2), and the light-shielding layer (LS) is overlapped with the second active layer (A2). The light shielding layer (LS) extends to an area below the second source electrode (S2), and the light shielding layer (LS) is overlapped with the connection electrode (CE1, CE2), to thereby improve a capacitance of the capacitor (C). In this case, the light shielding layer (LS) is formed of a conductive material, and may be connected with the second source electrode (S2) via the contact hole (x). The light shielding layer (LS) may be positioned in the same layer as the first connection line (CL, CL1) and the second connection layer (CL2), and may be formed of the same material as those of the first connection line (CL, CL1) and the second connection line (CL2).

A second circuit device column (C2) is prepared between the second data line (DL2) and the first reference line (Ref1). In the second circuit device column (C2), there are a switching thin film transistor (T1), a driving thin film transistor (T2), and a sensing thin film transistor (T3).

Except that a first source electrode (S1) is diverged from the second data line (DL2), the switching thin film transistor (T1) provided in the second circuit device column (C2) is identical in electrical connection structure to the switching thin film transistor (T1) provided in the first circuit device column (C1).

Except that a second source electrode (S2) is connected with an anode of an organic light emitting device in a second pixel via a second contact hole (CH2), the driving thin film transistor (T2) provided in the second circuit device column (C2) is identical in electrical connection structure to the driving thin film transistor (T2) provided in the first circuit device column (C1).

The sensing thin film transistor (T3) provided in the second circuit device column (C2) is identical in electrical connection structure to the sensing thin film transistor (T3) provided in the first circuit device column (C1).

Also, a light shielding layer (LS), which is identical to that of the first circuit device column (C1), is formed in the second circuit device column (C2).

A third circuit device column (C3) is prepared between the first reference line (Ref1) and the third data line (DL3). In the third circuit device column (C3), there are a switching thin film transistor (T1), a driving thin film transistor (T2), and a sensing thin film transistor (T3).

Except that a first source electrode (S1) is diverged from the third data line (DL3), the switching thin film transistor (T1) provided in the third circuit device column (C3) is identical in electrical connection structure to the switching thin film transistor (T1) provided in the first circuit device column (C1).

Except that a second source electrode (S2) is connected with an anode of an organic light emitting device in a third pixel via a third contact hole (CH3), the driving thin film transistor (T2) provided in the third circuit device column (C3) is identical in electrical connection structure to the driving thin film transistor (T2) provided in the first circuit device column (C1).

The sensing thin film transistor (T3) provided in the third circuit device column (C3) is identical in electrical connection structure to the sensing thin film transistor (T3) provided in the first circuit device column (C1).

Also, a light shielding layer (LS), which is identical to that of the first circuit device column (C1), is formed in the third circuit device column (C3).

Meanwhile, the high power line (VDD) and the low power line (VSS) may be respectively overlapped with auxiliary electrodes (AE1, AE2). The first auxiliary electrode (AE1) is connected with the high power line (VDD) via the contact hole (x), and the second auxiliary electrode (AE2) is connected with the low power line (VSS) via the contact hole (x). The first auxiliary electrode (AE1) extends in a lengthwise (i.e., vertical) direction of the high power line (VDD) below the high power line (VDD), and the first auxiliary electrode (AE1) may be overlapped with the high power line (VDD). The second auxiliary electrode (AE2) extends in a lengthwise (i.e., vertical) direction of the low power line (VSS) below the low power line (VSS), and the second auxiliary electrode (AE2) may be overlapped with the low power line (VSS). The first auxiliary electrode (AE1) and the second auxiliary electrode (AE2) may be positioned in the same layer as the first connection line (CL, CL1), the second connection line (CL2), and the light shielding layer (LS), and may be formed of the same material as the first connection line (CL, CL1), the second connection line (CL2), and the light shielding layer (LS). In order to prevent a short, each of the first auxiliary electrode (AE1) and the second auxiliary electrode (AE2) is provided at a predetermined interval from the first connection line (CL, CL1).

Also, the low power line (VSS) may be additionally overlapped with a third auxiliary electrode (AE3). The third auxiliary electrode (AE3) is formed between the low power line (VSS) and a cathode of an organic light emitting device so that the low power line (VSS) and the cathode of the organic light emitting device are connected with each other by the use of third auxiliary electrode (AE3). The third auxiliary electrode (AE3) is connected with the low power line (VSS) via a fourth contact hole (CH4), and is also connected with the cathode of the organic light emitting device via a fifth contact hole (CH5). The third auxiliary electrode (AE3) is positioned in the same layer as the anode of the organic light emitting device, and is formed of the same material as that of the anode of the organic light emitting device.

Figure 11:
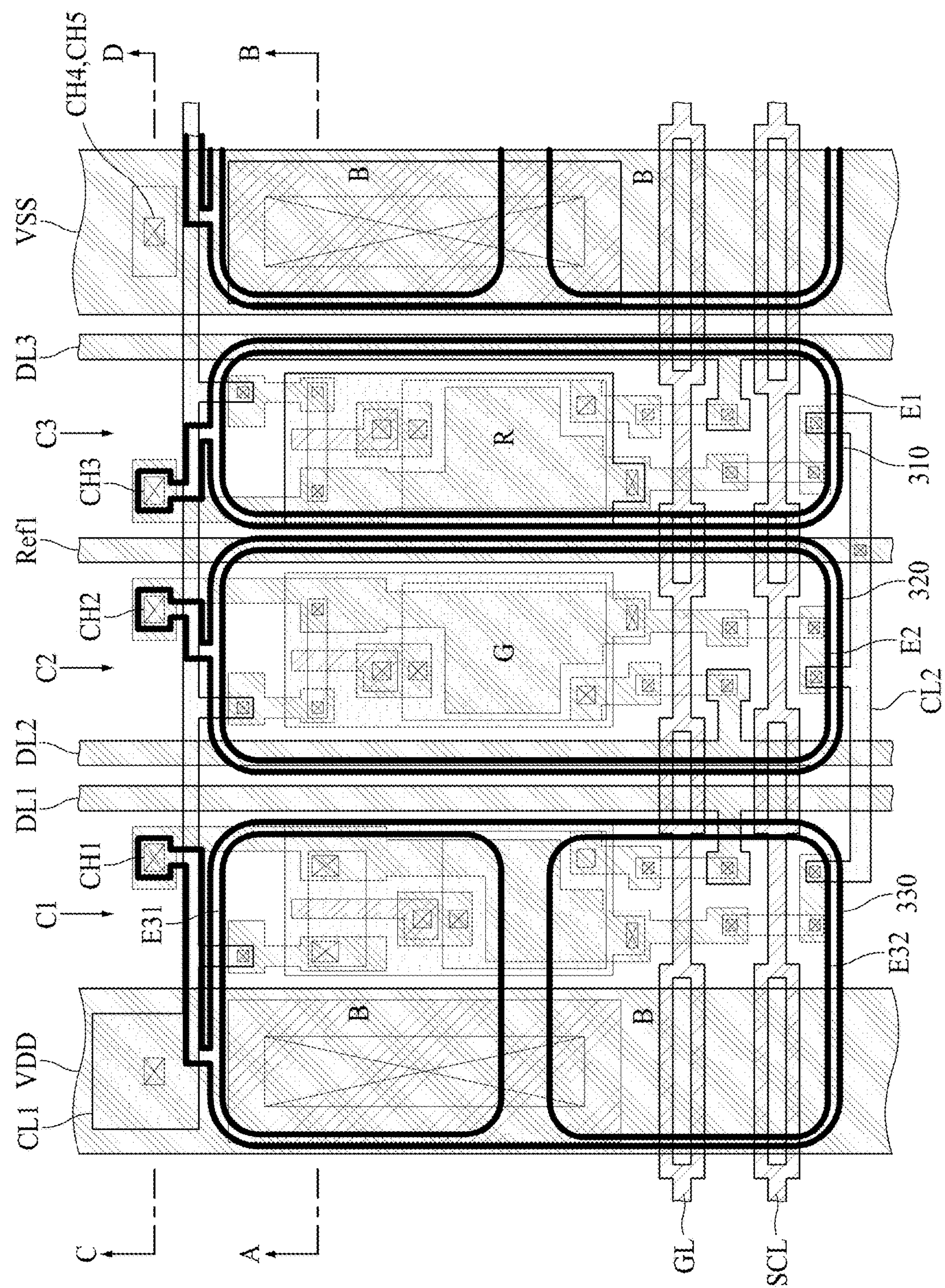
FIG. 11 is a plane view illustrating a plurality of emission areas arranged in an electroluminescent display device according to one aspect of the present disclosure, as shown in FIG. 10.

FIG. 11 is a plane view illustrating one aspect of a plurality of emission areas arranged in an electroluminescent display device shown in FIG. 10.

As shown in FIG. 11, a first emission area (E1) is overlapped with a third circuit device column (C3). In detail, the first emission area (E1) may be overlapped with a switching thin film transistor (T1), a driving thin film transistor (T2), and a sensing thin film transistor (T3) included in the third circuit device column (C3).

The first emission area (E1) is overlapped with a first electrode 310 which functions as an anode of an organic light emitting device. The first electrode 310 overlapped with the first emission area (E1) has a relatively large size in comparison to the first emission area (E1). The first electrode 310 overlapped with the first emission area (E1) is overlapped with the third circuit device column (C3), and may be overlapped with a third data line (DL3). If needed, the first electrode 310 overlapped with the first emission area (E1) may be overlapped with a first reference line (Ref1). The first electrode 310 overlapped with the first emission area (E1) is connected with a second source electrode (S2) of the driving thin film transistor (T2) provided in the third circuit device column (C3) via a third contact hole (CH3).

A second emission area (E2) is overlapped with a second circuit device column (C2). In detail, the second emission area (E2) is overlapped with a switching thin film transistor (T1), a driving thin film transistor (T2), and a sensing thin film transistor (T3) included in the second circuit device column (C2).

The second emission area (E2) is overlapped with a first electrode 320 which functions as an anode of an organic light emitting device. The first electrode 320 overlapped with the second emission area (E2) has a relatively large size in comparison to the second emission area (E2). The first electrode 320 overlapped with the second emission area (E2) is overlapped with the second circuit device column (C2), and may be overlapped with a second data line (DL2) and the first reference line (Ref1). The first electrode 320 overlapped with the second emission area (E2) is connected with a second source electrode (S2) of the driving thin film transistor (T2) provided in the second circuit device column (C2) via a second contact hole (CH2).

A third emission area (E31, E32) is overlapped with a high power line (VDD) and a first circuit device column (C1). In detail, a first sub emission area (E31) of the third emission area (E31, E32) is overlapped with one portion of the high power line (VDD) and a driving thin film transistor (T3) of the first circuit device column (C1), and a second sub emission area (E32) of the third emission area (E31, E32) is overlapped with another portion of the high power line (VDD) and a switching thin film transistor (T1) and a sensing thin film transistor (T2) of the first circuit device column (C1).

The third emission area (E31, E32) is overlapped with a first electrode 330 which functions as an anode of an organic light emitting device. The first electrode 330 overlapped with the third emission area (E31, E32) has a relatively large size in comparison to the third emission area (E31, E32).

The first electrode 330 overlapped with the third emission area (E31, E32) may be overlapped with the high power line (VDD) and the first circuit device column (C1). If needed, the first electrode 330 overlapped with the third emission area (E31, E32) may be overlapped with a first data line (DL1). The first electrode 330 overlapped with the third emission area (E31, E32) is connected with a second source electrode (S2) of the driving thin film transistor (T1) provided in the first circuit device column (C1) via a first contact hole (CH1).

Also, the third emission area (E31, E32) and the first electrode 330 overlapped with the third emission area (E31, E32) may be overlapped with a low power line (VSS) and a fourth circuit device column (C4) adjacent to the low power line (VSS).

Accordingly, a light emission of the first emission area (E1) is controlled by a circuit device provided in the third circuit device column (C3), a light emission of the second emission area (E2) is controlled by a circuit device provided in the second circuit device column (C2), and a light emission of the third emission area (E31, E32) is controlled by a circuit device provided in the first circuit device column (C1).

Figure 12:
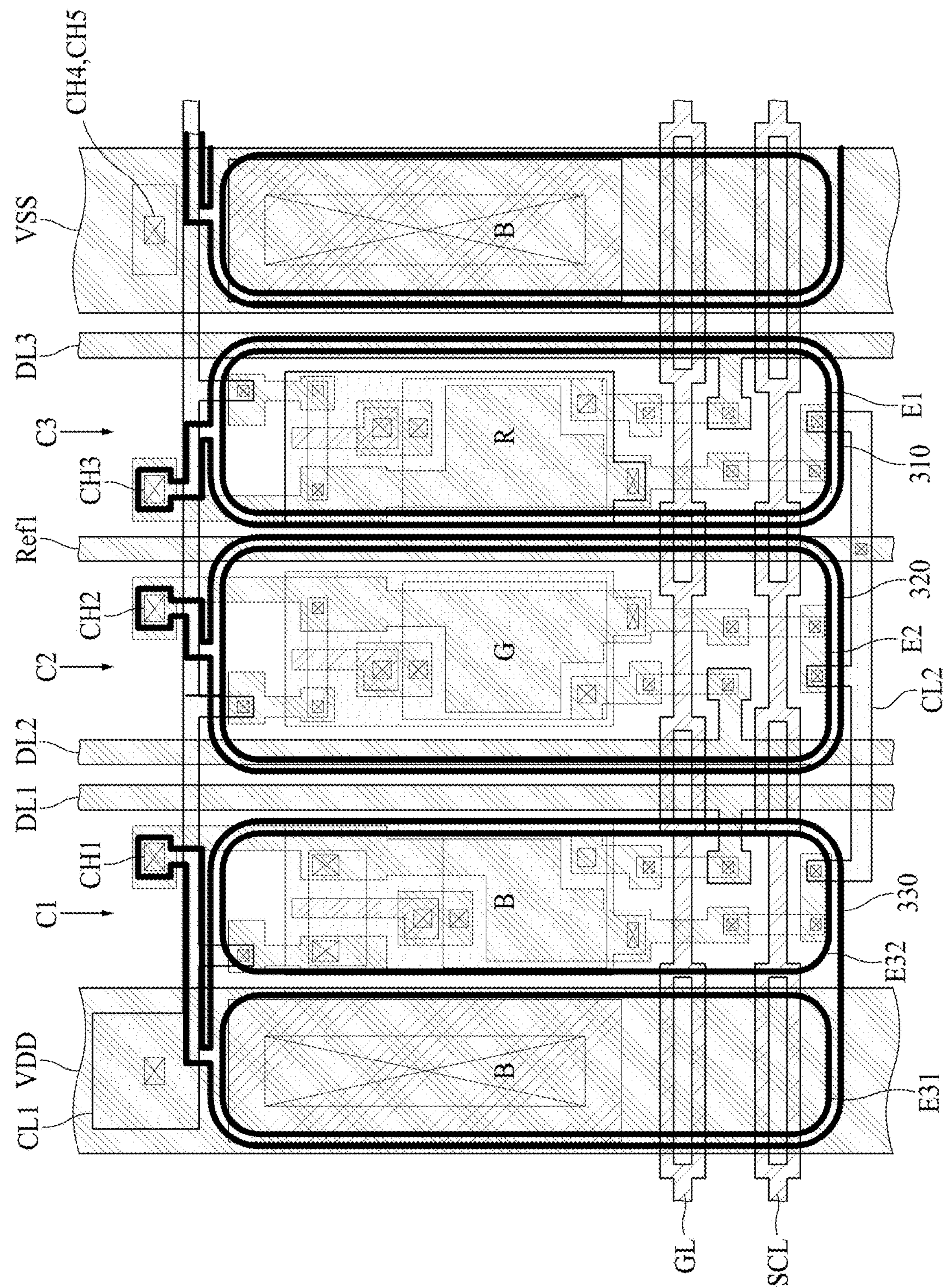
FIG. 12 is a plane view illustrating a plurality of emission areas arranged in an electroluminescent display device according to another aspect of the present disclosure, as shown in FIG. 10.

FIG. 12 is a plane view illustrating another aspect of a plurality of emission areas arranged in an electroluminescent display device shown in FIG. 10.

Except for a differing structure of a third emission area (E31, E32), the structure of FIG. 12 is identical to the above-described structure of FIG. 11, whereby only the different structures will be described in detail as follows.

A third emission area (E31, E32) is overlapped with a high power line (VDD) and a first circuit device column (C1). In detail, a first sub emission area (E31) of the third emission area (E31, E32) is overlapped with the high power line (VDD), and a second sub emission area (E32) of the third emission area (E31, E32) is overlapped with a switching thin film transistor (T1), a driving thin film transistor (T2), and a sensing thin film transistor (T3) included in the first circuit device column (C1).

Also, the first sub emission area (E31) of the third emission area (E31, E32) is overlapped with a low power line (VSS), and the second sub emission area (E32) of the third emission area (E31, E32) is overlapped with a switching thin film transistor (T1), a driving thin film transistor (T2), and a sensing thin film transistor (T3) included in a fourth circuit device column (C4) adjacent to the low power line (VSS).

Meanwhile, although not shown, the structure of the first to third emission layers 510, 520 and 530, the plurality of first electrodes 310, 320 and 330, the bank 400, and the emission area (E1, E2, E3), as shown in FIG. 2 or FIG. 3, may be arranged in the electroluminescent display device shown in FIG. 10.

Figure 13:
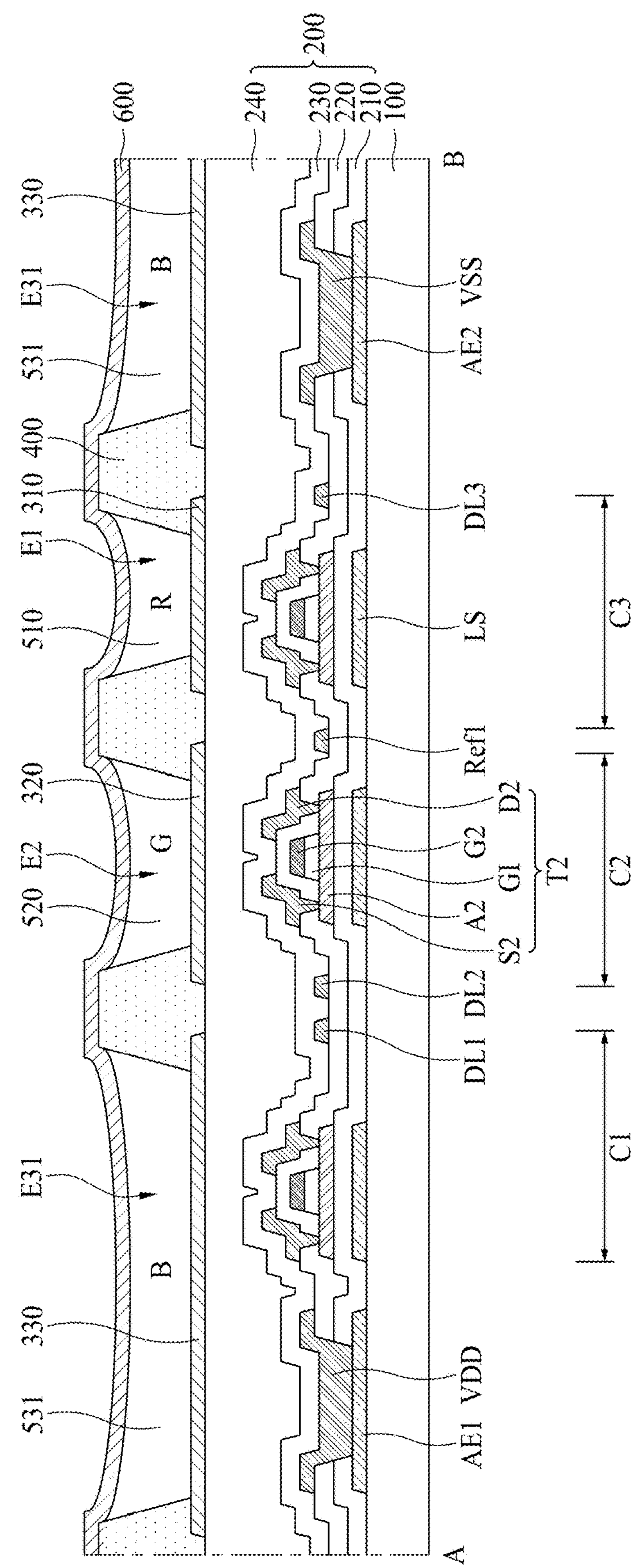
FIG. 13 is a cross sectional view along line A-B of FIG. 11.

FIG. 13 is a cross sectional view along A-B of FIG. 11. That is, FIG. 13 corresponds to a cross section of an area where a driving thin film transistor (T2) for each individual circuit device column (C1, C2, C3) is formed.

As shown in FIG. 13, a circuit device layer 200, a plurality of first electrodes 310, 320 and 330, a bank 400, an emission layer 510, 520 and 531, and a second electrode 600 are formed on a substrate 100.

The circuit device layer 200 includes an auxiliary electrode (AE1, AE2), a light shielding layer (LS), a high power line (VDD), a low power line (VSS), a driving thin film transistor (T2), a data line (DL1, DL2, DL3), a first reference line (Ref1), a buffer layer 210, an insulating interlayer 220, a passivation layer 230, and a planarization layer 240.

The auxiliary electrode (AE1, AE2) may include first and second auxiliary electrodes (AE1, AE2) formed on the substrate 100. The first auxiliary (AE1) is provided below the high power line (VDD), and the second auxiliary electrode (AE2) is provided below the low power line (VSS).

The light shielding layer (LS) is formed in each of first to third circuit device columns (C1, C2, C3) on the substrate 100. The light shielding layer (LS) may be positioned in the same layer as the auxiliary electrode (AE1, AE2), and may be formed of the same material as that of the auxiliary electrode (AE1, AE2).

The high power line (VDD) is provided on the first auxiliary electrode (AE1). In more detail, the buffer layer 210 and the insulating interlayer 220 are sequentially formed on the first auxiliary electrode (AE1), and the high power line (VDD) is formed on the insulating interlayer 220. The high power line (VDD) is connected with the first auxiliary electrode (AE1) via a contact hole provided in the buffer layer 210 and the insulating interlayer 220.

The low power line (VSS) is provided on the second auxiliary electrode (AE2). In more detail, the buffer layer 210 and the insulating interlayer 220 are sequentially formed on the second auxiliary electrode (AE2), and the low power line (VSS) is formed on the insulating interlayer 220. The low power line (VSS) is connected with the second auxiliary electrode (AE2) via a contact hole provided in the buffer layer 210 and the insulating interlayer 220.

The driving thin film transistor (T2) is provided in each of the first to third circuit device columns (C1, C2, C3). The driving thin film transistor (T2) may include a second active layer (A2) provided on the buffer layer 210, a gate insulating film (GI) provided on the second active layer (A2), a second gate electrode (G2) provided on the gate insulating film (GI), and second source and drain electrodes (S2, D2) provided on the insulating interlayer 220 and respectively connected with the second active layer (A2) via contact holes provided in the insulating interlayer 220. A width of the second active layer (A2) may be smaller than a width of the light shielding layer (LS).

The data line (DL1, DL2, DL3) is provided on the insulating interlayer 220. The data line (DL1, DL2, DL3) may include the first and second data lines (DL1, DL2) provided between the first circuit device column (C1) and the second circuit device column (C2), and the third data line (DL3) provided between the third circuit device column (C3) and the low power line (VSS).

The first reference line (Ref1) is formed on the insulating interlayer 220. The first reference line (Ref1) is provided between the second circuit device column (C2) and the third circuit device column (C3).

The high power line (VDD), the low power line (VSS), the second source electrode (S2), the second drain electrode (D2), the data line (DL1, DL2, DL3), and the first reference line (Ref1), which are provided on the insulating interlayer 220, may be formed of the same material.

The passivation layer 230 is formed on the high power line (VDD), the low power line (VSS), the second source electrode (S2), the second drain electrode (D2), the data line (DL1, DL2, DL3), and the first reference line (Ref1).

The planarization layer 240 is formed on the passivation layer 230.

The plurality of first electrodes 310, 320 and 330 is formed on the planarization layer 240. The plurality of first electrodes 310, 320 and 330 is patterned to correspond in area to the emission area (E1, E2, E3).

The first electrode 310 overlapped with the first emission area (E1) is overlapped with the third circuit device column (C3). Also, the first electrode 320 overlapped with the second emission area (E2) is overlapped with the second circuit device column (C2). Also, the first electrode 330 overlapped with the first sub emission area (E31) of the third emission area (E31, E32) is overlapped with the high power line (VDD) and the first circuit device column (C1). Also, the first electrode 330 overlapped with the first sub emission area (E31) of the third emission area (E31, E32) is overlapped with the low power line (VSS) and the fourth circuit device column adjacent to the low power line (VSS).

The bank 400 is configured to cover both ends of the plurality of first electrodes 310, 320 and 330, and is provided on the planarization layer 240. The emission area (E1, E2, E3) is defined by the bank 400.

The first emission area (E1) is overlapped with the third circuit device column (C3), the second emission area (E2) is overlapped with the second circuit device column (C2), and the first sub emission area (E31) of the third emission area (E31, E32) is overlapped with the high power line (VDD) and the first circuit device column (C1). Also, the first sub emission area (E31) of the third emission area (E31, E32) is overlapped with the low power line (VSS) and the fourth circuit device column adjacent to the low power line (VSS).

The emission layer 510, 520 and 531 is individually formed in the emission area (E1, E2, E31). The emission layer 510, 520 and 531 may include the first emission layer 510 formed of the red (R) emission layer on the first electrode 310, the second emission layer 520 formed of the green (G) emission layer on the first electrode 320, and the first sub emission layer 531 formed of the blue (B) emission layer on the first electrode 330.

The second electrode 600 is formed on the emission layer 510, 520 and 531. The second electrode 600 is formed on the bank 400, whereby the second electrode 600 may be formed in the plurality of pixels, and also formed in the boundary area between each of the plurality of pixels.

Figure 14:
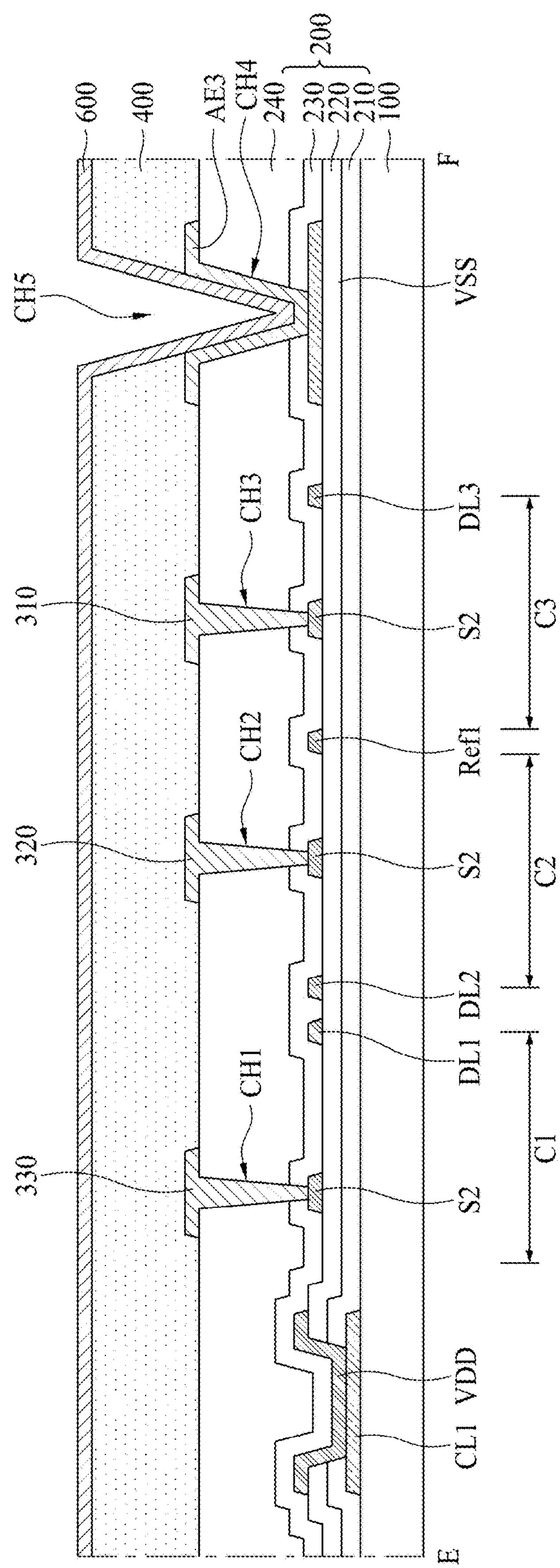
FIG. 14 is a cross sectional view along line C-D of FIG. 11.

FIG. 14 is a cross sectional view along C-D of FIG. 11. That is, FIG. 14 corresponds to a cross section of a contact hole (CH1, CH2, CH3, CH4, CH5) area.

As shown in FIG. 14, a circuit device layer 200, a plurality of first electrodes 310, 320 and 330, a third auxiliary electrode (AE3), a bank 400, and a second electrode 600 are formed on a substrate 100.

The circuit device layer 200 may include a first connection line (CL, CL1), a high power line (VDD), a low power line (VSS), a second source electrode (S2), a data line (DL1, DL2, DL3), a first reference line (Ref1), a buffer layer 210, an insulating interlayer 220, a passivation layer 230, and a planarization layer 240.

The first connection line (CL, CL1) is formed on the substrate 100. The first connection line (CL, CL1) is provided below the high power line (VDD). The first connection line (CL, CL1) is positioned in the same layer as the aforementioned first and second auxiliary electrodes (AE1, AE2) and the light shielding layer (LS), and the first connection line (CL, CL1) is formed of the same material as those of the first and second auxiliary electrodes (AE1, AE2) and the light shielding layer (LS).

The high power line (VDD) is provided above the first connection line (CL, CL1). In more detail, the buffer layer 210 and the insulating interlayer 220 are sequentially formed on the first connection line (CL, CL1), and the high power line (VDD) is formed on the insulating interlayer 220. The high power line (VDD) is connected with the first connection line (CL, CL1) via a contact hole provided in the buffer layer 210 and the insulating interlayer 220.

The low power line (VSS) is formed on the insulating interlayer 220.

The second source electrode (S2) is formed in each of first to third circuit device columns (C1, C2, C3). Especially, the second source electrode (S2) is formed on the insulating interlayer 220.

The data line (DL1, DL2, DL3), the first reference line (Ref1), the buffer layer 210, the insulating interlayer 220, the passivation layer 230, and the planarization layer 240 are the same as those of FIG. 13.

The plurality of first electrodes 310, 320 and 330 is formed on the planarization layer 240. The first electrode 310 extending to an area corresponding to a first emission area (E1) is connected with the second source electrode (S2) provided in the third circuit device column (C3) via a third contact hole (CH3) provided in the passivation layer 230 and the planarization layer 240. The first electrode 320 extending to an area corresponding to a second emission area (E2) is connected with the second source electrode (S2) provided in the second circuit device column (C2) via a second contact hole (CH2) provided in the passivation layer 230 and the planarization layer 240. The first electrode 330 extending to an area corresponding to a third emission area (E3) is connected with the second source electrode (S2) provided in the first circuit device column (C1) via a first contact hole (CH1) provided in the passivation layer 230 and the planarization layer 240.

The third auxiliary electrode (AE3) is formed on the planarization layer 240. The third auxiliary electrode (AE3) is connected with the low power line (VSS) via a fourth contact hole (CH4) provided in the passivation layer 230 and the planarization layer 240. The third auxiliary electrode (AE3) is formed of the same material as that of the plurality of first electrodes 310, 320 and 330.

The bank 400 is formed on the plurality of first electrodes 310, 320 and 330 and the third auxiliary electrode (AE3). FIG. 14 corresponds to the boundary area between each of pixels, wherein the bank 400 is formed on the entire area of the substrate 100.

The second electrode 600 is formed on the bank 400. The second electrode 600 is connected with the third auxiliary electrode (AE3) via a fifth contact hole (CH5) formed in the bank 400. Thus, the second electrode 600 is connected with the low power line (VSS) via the third auxiliary electrode (AE3).

Figure 15:
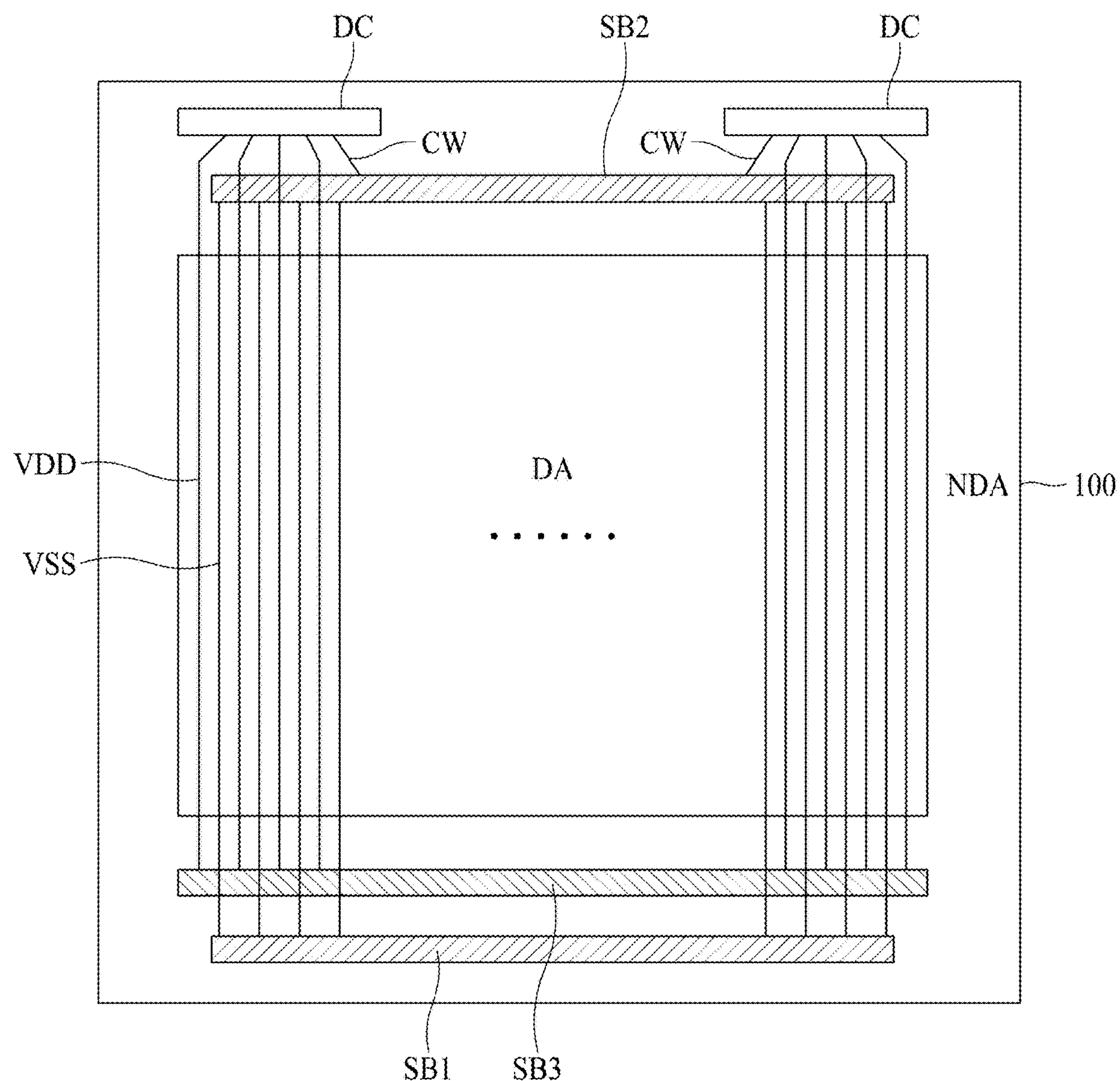
FIG. 15 is a plane view illustrating an electroluminescent display device having a display area and a non-display area according to one aspect of the present disclosure.

FIG. 15 is a plane view illustrating an electroluminescent display device having a display area and a non-display area according to one aspect of the present disclosure.

As shown in FIG. 15, the display area (DA) is prepared in the center of a substrate 100, and the non-display area (NDA) is prepared in the periphery of the display area (DA). The display area (DA) corresponds to the area for displaying an image by the use of light emission, and the non-display area (NDA) corresponds to the area in which a light emission is not generated, and thus, an image is not displayed. A pixel structure according to the aforementioned various aspects of the present disclosure is formed in the display area (DA).

A plurality of dummy pixels may be formed in the non-display area (NDA). The plurality of dummy pixels may be provided to surround a plurality of pixels formed in the display area (DA). The plurality of dummy pixels may include a dummy layer formed in each of a plurality of dummy areas defined by a bank layer. Herein, as an image is not displayed on the dummy pixel, a light emission is not generated in the dummy layer. The dummy layer is provided to realize uniformity of profile between an emission layer in the center of the display area (DA) and an emission layer in the edge of the display area (DA).

If the emission layer in the display area (DA) is formed by a solution process, a drying speed of the emission layer in the center of the display area (DA) may be different from a drying speed of the emission layer at the edge of the display area (DA), whereby a profile of the emission layer in the center of the display area (DA) and a profile of the emission layer at the edge of the display area (DA) may be not uniform. Thus, it is difficult to realize uniformity of light emission in the display area (DA). For this reason, the dummy pixel is formed in the non-display area (NDA), and the dummy emission layer is also formed in the non-display area (NDA) when the emission layer is formed in the display area (DA). That is, even though the profile is not uniform in the dummy layer and the emission layer, it is possible to realize the uniform profile of the emission layer in the entire display area (DA).

A plurality of high power lines (VDD) and a plurality of low power lines (VSS) are alternately arranged in a first direction, for example a vertical direction, in the display area (DA). The plurality of high power lines (VDD) and the plurality of low power lines (VSS) extend to the non-display area (NDA).

Respective lower ends of the plurality of low power lines (VSS) may be connected with each other by the use of first shorting bar (SB1), and respective upper ends of the plurality of low power lines (VSS) may be connected with each other by the use of second shorting bar (SB2), whereby the plurality of low power lines (VSS) may be electrically connected with each other. Each of the first shorting bar (SB1) and the second shorting bar (SB2) is formed in the non-display area (NDA). The first shorting bar (SB1) and the second shorting bar (SB2) may be positioned in the same layer as the aforementioned plurality of first electrodes 310, 320 and 330, and may be formed of the same material as that of the aforementioned plurality of first electrodes 310, 320 and 330. The second shorting bar (SB2) may be connected with a driving circuit portion (DC) provided in the non-display area (NDA) via a contact wire (CW). Thus, low power applied through the driving circuit portion (DC) may be transmitted to the plurality of low power lines (VSS) via the contact wire (CW) and the second shorting bar (SB2).

Respective lower ends of the plurality of high power lines (VDD) may be connected with each other by the use of third shorting bar (SB3). Thus, the plurality of high power lines (VDD) may be electrically connected with each other. Also, respective upper ends of the plurality of high power lines (VDD) may be connected with the driving circuit portion (DC). Thus, high power may be applied to the plurality of high power lines (VDD) via the driving circuit portion (DC).

According to one aspect of the present disclosure, the thickness of the first electrode is increased to obtain the micro-cavity property, whereby the red emission layer positioned above the first electrode is decreased in its thickness.

Thus, when the red emission layer is formed by the solution process, it is possible to decrease the number of solution spraying times through the inkjet nozzle, thereby shortening the processing time. Also, as the thickness of the first electrode below the blue emission layer is decreased, it is possible to realize the micro-cavity property and also to prevent the thickness of the blue emission layer from being decreased, whereby it is possible to realize the uniform profile in the blue emission layer, and to prevent the dark spot in the area of the blue emission layer.

It will be apparent to those skilled in the art that the present disclosure described above is not limited by the above-described aspects and the accompanying drawings and that various substitutions, modifications, and variations can be made in the present disclosure without departing from the scope of the disclosure. Consequently, the scope of the present disclosure is defined by the accompanying claims, and it is intended that all variations or modifications derived from the meaning, scope, and equivalent concept of the claims fall within the scope of the present disclosure.

The various aspects described above can be combined to provide further aspects of the aspects can be modified, if necessary, to provide yet further aspects.

These and other changes can be made to the aspects in light of the above-detailed description. In general, in the following claims, the terms used should not be construed to limit the claims to the specific aspects disclosed in the specification and the claims, but should be construed to include all possible aspects. Accordingly, the claims are not limited by the disclosure.

What is claimed is:

1. An electroluminescent display device comprising:

a substrate;

a bank provided on the substrate and defining a first emission area and a second emission area;

a first emission layer provided in the first emission area;

a second emission layer provided in the second emission area;

a plurality of lower electrodes including a first lower electrode provided below the first emission layer and a second lower electrode provided below the second emission layer, wherein the first lower electrode includes a first portion having a thickness greater than a thickness of a first portion of the second lower electrode, wherein the first lower electrode includes a second portion not overlapping the first emission area and the second lower electrode includes a second portion not overlapping the second emission area, wherein the second portion of the first lower electrode has a same thickness as the second portion of the second lower electrode.

2. The electroluminescent display device according to claim 1, wherein the first portion of the first lower electrode corresponds to the first emission area, and the first portion of the second lower electrode corresponds to the second emission area.

3. The electroluminescent display device according to claim 1, wherein the first portion of the first lower electrode overlaps the first emission area, and the first portion of the second lower electrode overlaps the second emission area.

4. The electroluminescent display device according to claim 1, wherein the bank includes a first bank and a second bank.

5. The electroluminescent display device according to claim 4, wherein the first bank is hydrophilic and the second bank is hydrophobic.

6. The electroluminescent display device according to claim 1, further comprising at least one data line extending in a first direction and disposed between the first emission area and the second emission area, wherein a portion of the bank extends between the first emission area and the second emission area in the first direction and overlaps the at least one data line.

7. The electroluminescent display device according to claim 4, further comprising at least one data line extending in a first direction and disposed between the first emission area and the second emission area, wherein a portion of the second bank extends between the first emission area and the second emission area in the first direction and overlaps the at least one data line.

8. The electroluminescent display device according to claim 1, wherein the first lower electrode includes a first stacked lower layer, a first stacked middle layer provided on the first stacked lower layer, a first stacked upper stacked layer provided on the first stacked middle layer, and a first stacked cover layer provided on the first stacked upper layer and extending to a lateral surface of the first stacked upper layer, a lateral surface of the first stacked middle layer, and a lateral surface of the first stacked lower layer, and wherein the second lower electrode includes a second stacked lower layer, a second stacked middle layer provided on the second stacked lower layer, a second stacked upper layer provided on the second stacked middle layer, and a second stacked cover layer provided on the second stacked upper layer and extending to a lateral surface of the second stacked upper layer, a lateral surface of the second stacked middle layer, and a lateral surface of the second stacked lower layer.

9. The electroluminescent display device according to claim 8, wherein the first stacked cover layer is in contact with the first emission layer, and the second stacked upper layer is in contact with the second emission layer.

10. The electroluminescent display device according to claim 8, wherein the first stacked cover layer overlaps the first emission area, and the second stacked cover layer does not overlap the second emission area.

11. The electroluminescent display device according to claim 8, wherein the first stacked cover layer has a thickness greater than a thickness of the first stacked lower layer and a thickness of the first stacked upper layer, and less than a thickness of the first stacked middle layer.

12. The electroluminescent display device according to claim 1, wherein the first emission layer has a thickness less than a thickness of the second emission layer.

13. The electroluminescent display device according to claim 12, wherein each of the first emission layer and the second emission layer includes a hole injecting layer, a hole transporting layer, and an emitting material layer, wherein the hole injecting layer of the first emission layer has a thickness less than a thickness of the hole injecting layer of the second emission layer, and wherein the emitting material layer of the first emission layer has a thickness greater than a thickness of the emitting material layer of the second emission layer.

14. The electroluminescent display device of claim 1, wherein the second emission area includes a first sub emission area and a second sub emission area which are separated from each other, and the bank is positioned between the first sub emission area and the second sub emission area, and wherein the second emission layer includes a first sub emission layer provided in the first sub emission area and a second sub emission layer provided in the second sub emission area.

15. The electroluminescent display device according to claim 14, wherein the second lower electrode has a first portion exposed in the first sub emission area and a second portion exposed in the second sub emission area.

16. The electroluminescent display device according to claim 1, further comprising a dummy area, the dummy area disposed in a non-display area adjacent to an edge of a display area, the display area having the first and second emission areas.

17. The electroluminescent display device of claim 1, further comprising an upper electrode disposed on the bank, the first emission area and the second emission area, wherein a first distance between the first lower electrode and the upper electrode at a center of the first emission area is less than a second distance between the first lower electrode and the upper electrode at a side of the first emission area.

18. An electroluminescent display device comprising:

a substrate;

a power line including a high power line and a low power line arranged in a first direction on the substrate;

a plurality of circuit device columns provided with a plurality of thin film transistors and positioned between the high power line and the low power line on the substrate, a bank provided on the power line and the plurality of circuit device columns, and defining a first emission area, a second emission area, and a third emission area;

a first emission layer provided in the first emission area;

a second emission layer provided in the second emission area; and a third emission layer provided in the third emission area, wherein the first emission area overlaps a first circuit device column of the plurality of circuit device columns, the second emission area overlaps the high power line or the low power line, and overlaps a second circuit device column of the plurality of circuit device columns, and the third emission area overlaps a third circuit device column of the plurality of circuit device columns.

19. The electroluminescent display device of claim 18, wherein the plurality of thin film transistors includes oxide thin film transistors.

20. The electroluminescent display device according to claim 18 wherein the second emission area includes a first sub emission area and a second sub emission area which are separated from each other, the first sub emission area overlaps the high power line or the low power line, and the second sub emission area overlaps the another one of the plurality of circuit device columns.

21. The electroluminescent display device according to claim 18, wherein the second emission area includes a first sub emission area and a second sub emission area which are separated from each other, each of the first sub emission area and the second sub emission area overlaps the high power line or the low power line, and the another one of the plurality of circuit device columns.

* * * * *